US007065123B2

(12) United States Patent
Mori et al.

(10) Patent No.: US 7,065,123 B2
(45) Date of Patent: Jun. 20, 2006

(54) DISTRIBUTED FEEDBACK SEMICONDUCTOR LASER FOR OUTPUTTING BEAM OF SINGLE WAVELENGTH

(75) Inventors: Hiroshi Mori, Yamato (JP); Tomoyuki Kikugawa, Atsugi (JP); Yoshio Takahashi, Sagamihara (JP); Motoaki Fujita, Atsugi (JP)

(73) Assignee: Anritsu Corporation, Tokyo (JP)

( * ) Notice: Subject to any disclaimer, the term of this patent is extended or adjusted under 35 U.S.C. 154(b) by 406 days.

(21) Appl. No.: 10/461,771

(22) Filed: Jun. 13, 2003

(65) Prior Publication Data

US 2004/0001522 A1   Jan. 1, 2004

(30) Foreign Application Priority Data

Jun. 27, 2002 (JP) ............................. 2002-188530
Jun. 27, 2002 (JP) ............................. 2002-188531

(51) Int. Cl.
*H01S 3/08* (2006.01)
*H01S 5/00* (2006.01)
(52) U.S. Cl. .................................. 372/96; 372/50.11
(58) Field of Classification Search ................. 372/96, 372/50.11
See application file for complete search history.

(56) References Cited

U.S. PATENT DOCUMENTS

| | | | |
|---|---|---|---|
| 5,020,072 A |   | 5/1991 | Abe et al. |
| 5,274,660 A | * | 12/1993 | Abe .............................. 372/96 |
| 5,960,023 A | * | 9/1999 | Takahashi .................... 372/96 |
| 6,608,855 B1 | * | 8/2003 | Hwang et al. ............... 372/96 |

FOREIGN PATENT DOCUMENTS

EP   0 533 485 A1   3/1993

(Continued)

OTHER PUBLICATIONS

Nilsson S. et al., "Improved Spectral Characteristics of MQW-DFB Lasers by Incorporation of Multiple Phase-Shifts" Journal of Lightwave Technology, IEEE. New York, US, vol. 13, No. 3, Mar. 1, 1995, pp. 434-441, XP000509308, ISSN: 0733-8724.
Nilsson S. et al., "DFB Laser with Nonuniform Coupling Coefficient Realized by Double-Layer Buried Grating" IEEE Photonics Technology Letters, IEEE Inc. New York, US, vol. 5, No. 10, Oct. 1, 1993, pp. 1128-1131, XP000414197, ISSN: 1041-1135.

*Primary Examiner*—James Menefee
(74) *Attorney, Agent, or Firm*—Frishauf, Holtz, Goodman & Chick, P.C.

(57) ABSTRACT

First and second diffraction grating layers are provided above a semiconductor substrate, and are spaced from each other in an output direction of a beam with a flat connecting layer sandwiched therebetween. An active layer is disposed above or below the first and second diffraction grating layers and the connecting layer. A cladding layer is disposed above the active layer or above the first and second diffraction grating layers and the connecting layer. A diffraction grating including the first and second diffraction grating layers has a plurality of slits penetrating from an upper surface to a lower surface that are perpendicular to the output direction of the beam. The connecting layer is formed from two layers grown epitaxially in a direction perpendicular to the output direction of the beam. One of the two layers is formed of the same material as the first and second diffraction grating layers.

20 Claims, 10 Drawing Sheets

FOREIGN PATENT DOCUMENTS

| | | |
|---|---|---|
| EP | 0 732 783 A1 | 9/1996 |
| JP | 60-192378 | 9/1985 |
| JP | 4-111383 A | 4/1992 |
| JP | 9-307179 A | 11/1997 |
| JP | 9-312437 A | 12/1997 |
| JP | 2000-58961 A | 2/2000 |

* cited by examiner

P0: Beam output intensity

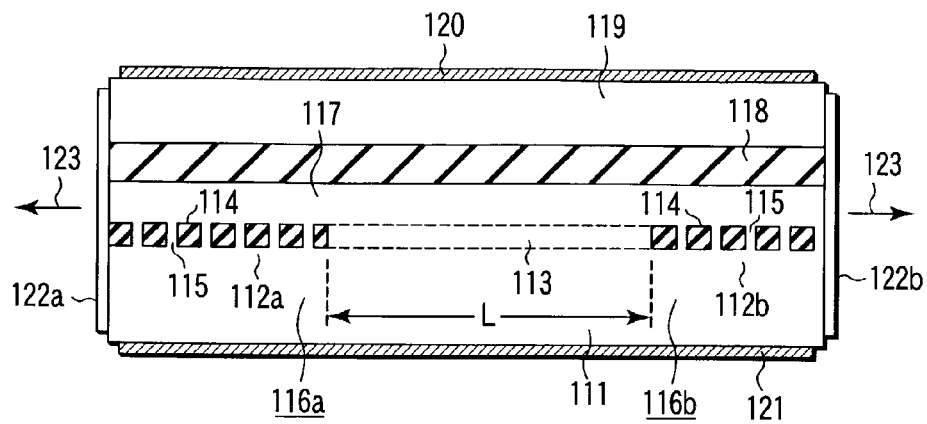
F I G. 9
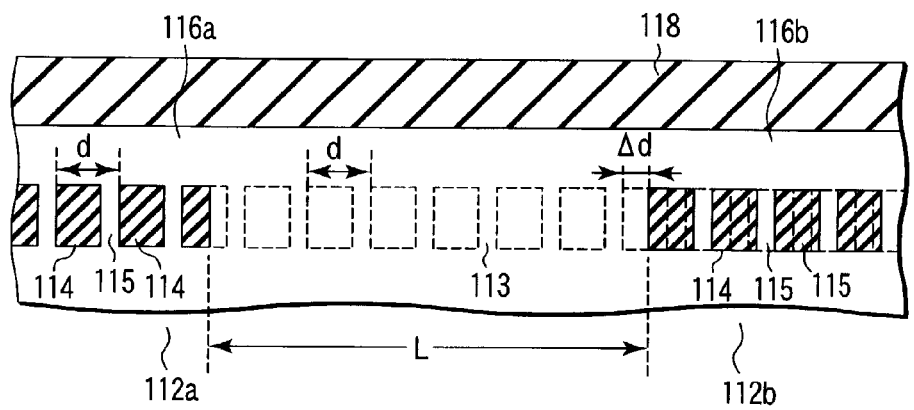
F I G. 10
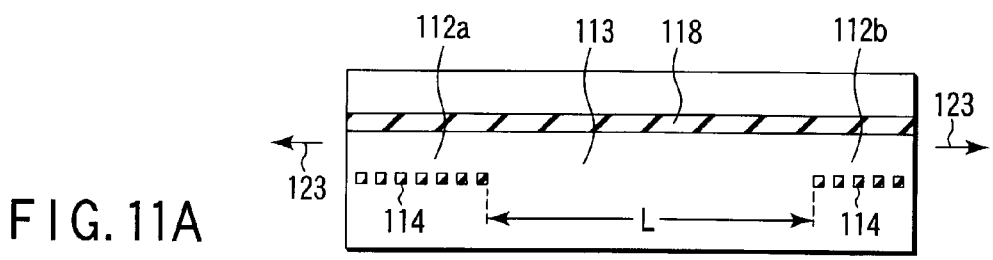
F I G. 11A
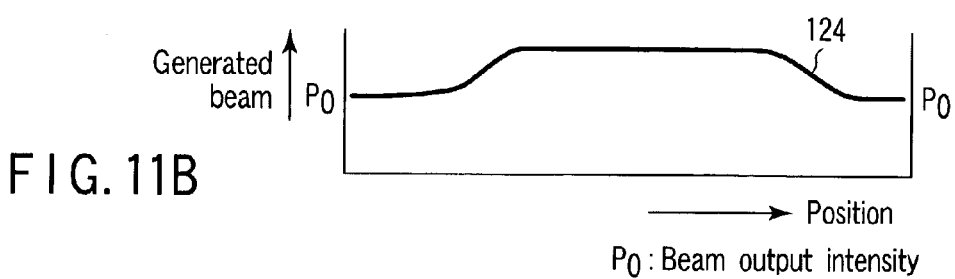
F I G. 11B
$P_0$: Beam output intensity

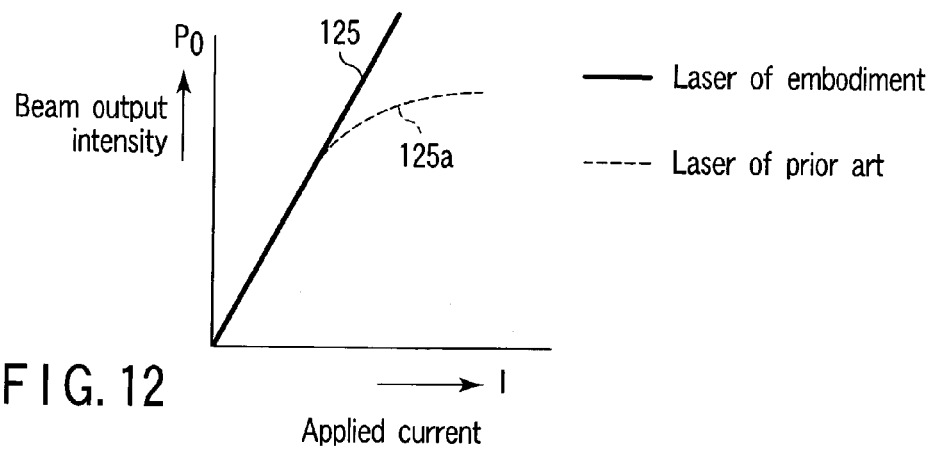
F I G. 12
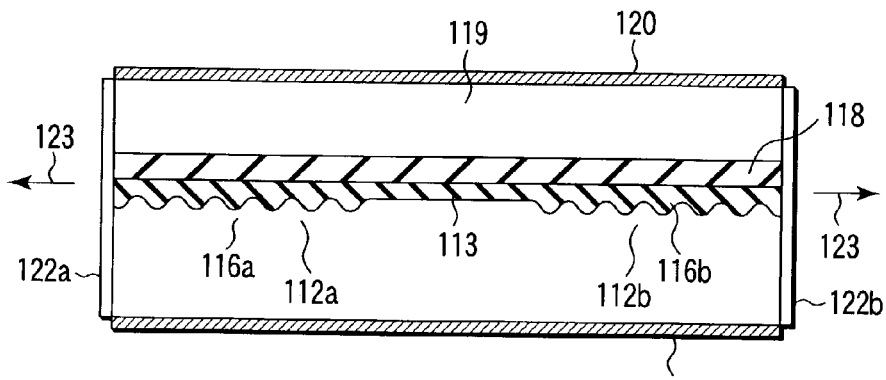
F I G. 13
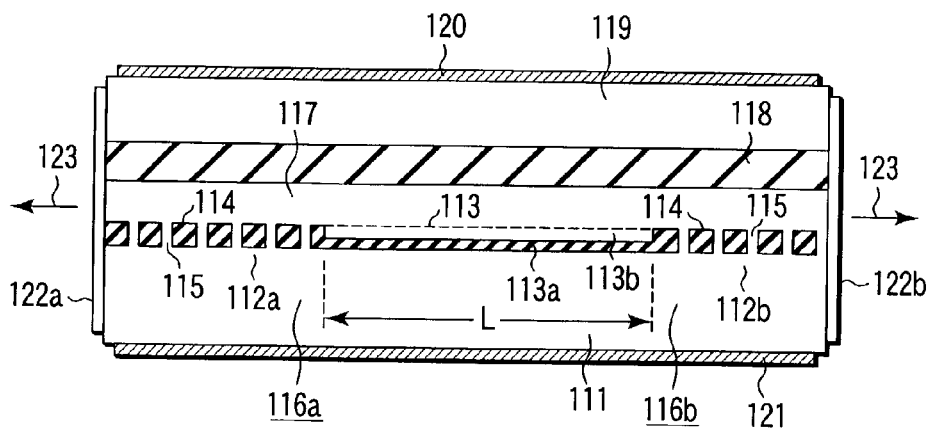
F I G. 14

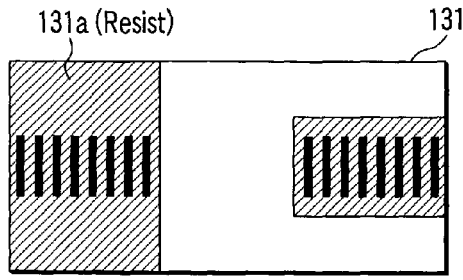
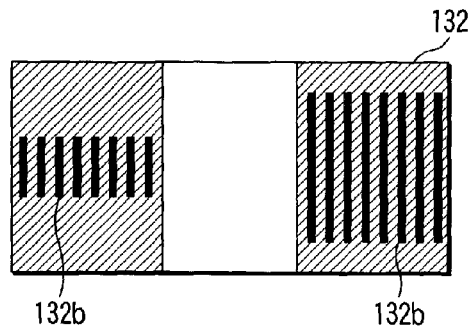
F I G. 20A  F I G. 20B
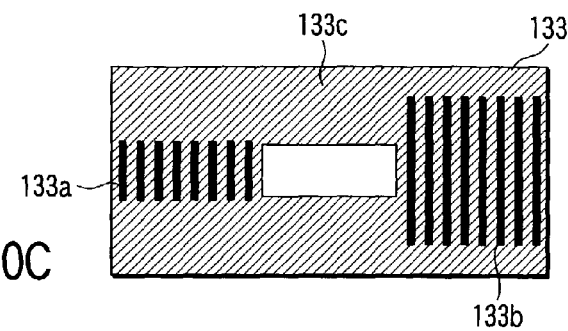
F I G. 20C
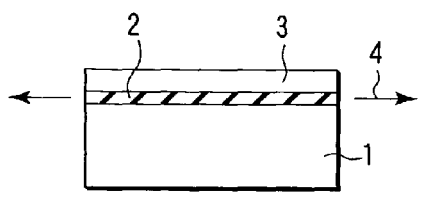
F I G. 21A PRIOR ART  F I G. 21B PRIOR ART
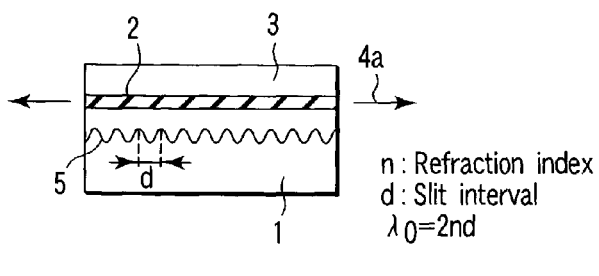
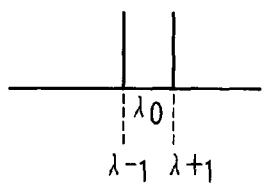
F I G. 21C PRIOR ART  F I G. 21D PRIOR ART $P_0$: Beam output intensity

DISTRIBUTED FEEDBACK SEMICONDUCTOR LASER FOR OUTPUTTING BEAM OF SINGLE WAVELENGTH

CROSS-REFERENCE TO RELATED APPLICATIONS

This application is based upon and claims the benefit of priority from the prior Japanese Patent Applications No. 2002-188530, filed Jun. 27, 2002; and No. 2002-188531, filed Jun. 27, 2002, the entire contents of both of which are incorporated herein by reference.

BACKGROUND OF THE INVENTION

1. Field of the Invention

The present invention relates to a distributed feedback semiconductor laser, and more specifically to a distributed feedback semiconductor laser which outputs a beam of a single wavelength for such purposes as optical communication and optical measurement.

2. Description of the Related Art

As shown in FIG. 21A, a conventional semiconductor laser which outputs a beam for use in optical communication and optical measurement comprises, for example, a semiconductor substrate 1, on which an active layer 2 and a cladding layer 3 are grown epitaxially.

In such a semiconductor laser, a beam 4 is outputted from each facet of the active layer 2 when a predetermined voltage is applied between a lower surface of the semiconductor substrate 1 and an upper surface of the cladding layer 3.

In close examination, as shown in FIG. 21B, the beam 4 can be regarded as a set of beams each having a slightly different wavelength $\lambda$ from others.

In order to output the beam 4 of a single wavelength $\lambda_0$, proposals have been made for a distributed feedback (DFB) semiconductor laser as shown in FIG. 21C, which includes a diffraction grating 5 formed near the active layer 2 and in a direction in which the beam 4 is outputted.

In a DFB semiconductor laser having the diffraction grating 5 incorporated therein, assuming that n is an effective refractive index of an optical waveguide, and d is a grating pitch, of a beam having many different wavelengths $\lambda$ and generated from the active layer 2, a beam 4a having a single wavelength $\lambda_0$ that satisfies the condition of wavelength $\lambda$=2nd should be outputted.

However, according to this DFB semiconductor laser, if the diffraction grating 5 formed inside is of a phase continuous type, being uniform in the beam outputting direction as shown in FIG. 21C, resulting oscillation is not genuine "single-mode oscillation" based on the single wavelength $\lambda_0$ in principle.

Specifically, in this case, as shown in FIG. 21D, the beam having the wavelength $\lambda_0$ that satisfies the condition of $\lambda$=2nd is not outputted but rather, the outputted beam is of two wavelengths $\lambda_{+1}$ and $\lambda_{-1}$, i.e. values sandwiching the intended wavelength $\lambda_0$.

In an attempt to eliminate such a problem and to realize the "single-mode oscillation," a phase shifting structure called $\lambda/4$ shifting structure is formed at a midpoint of the diffraction grating 5 so that phase of the beam is shifted as much as $\lambda/4$.

However, the diffraction grating 5 having the phase shifting structure at a midpoint thereof cannot be manufactured in batch exposure process by using holographic lithography method which is simple and advantageous for mass manufacture. For this reason, manufacturers employ a manufacturing method of drawing for a long time using electron beam lithography.

On the other hand, the Japanese Patent No. 1781186 (Jpn. Pat. Appln. KOKOKU Publication No. 4-67356, Jpn. Pat. Appln. KOKAI Publication No. 60-192378) discloses a DFB semiconductor laser that uses a diffraction grating formed by the holographic lithography method yet has a performance equal to that achieved by the gratings having the $\lambda/4$ shifting structure.

Specifically, in this DFB semiconductor laser, as shown in FIG. 22, the active layer 2 has a lower surface formed with first and second diffraction grating waveguides 6a, 6b and a flat connecting waveguide 7 connecting the first and second diffraction grating waveguides 6a, 6b as an integrated structure on the same plane.

Each of the diffraction gratings in the first and second diffraction grating waveguides 6a, 6b is formed by matching respective phases so as to serve as part of one virtual diffraction grating by using the holographic lithography method.

The connecting waveguide 7 has a specific propagation characteristic. Specifically, as compared to the case where the connecting waveguide 7 has the same structure as the first and second diffraction grating waveguides, the phase of the passing beam is shifted from $\pi$ multiplied by an integer.

Note that the related document describes that according to this DFB semiconductor laser, "phase of the beam passing from the first diffraction grating waveguide 6a to the second diffraction grating waveguide 6b is shifted from $\pi$ multiplied by an integer". It is obvious, however, that a manufactured DFB semiconductor laser has a higher probability of outputting a beam at a single wavelength when "the phase of the beam passing from the first diffraction grating waveguide 6a to the second diffraction grating waveguide 6b is shifted from $\pi$ multiplied by a half value of an odd integer ($\pi/2$, $3\pi/2$, $5\pi/2$, . . . )".

However, the DFB semiconductor laser having the structure shown in FIG. 22 still has the following problems yet to be solved.

First, discussion will be made for the length L of the connecting waveguide 7 which is a function of shifting the phase of the beam that passes from the first diffraction grating waveguide 6a to the second diffraction grating waveguide 6b from $\pi$ multiplied by an integer.

In general, in the connecting waveguide 7, the phase of a beam traveling on the connecting waveguide 7 is shifted as compared to the case in which there is a diffraction grating placed instead. This is because the structural difference in the optical waveguide, i.e. presence or absence of the diffraction grating, makes a slight difference in the beam's propagation constant which corresponds to the propagation velocity of the beam.

In other words, the beam's propagation constant is determined by an effective refractive index n which the traveling beam is sensitive to.

Referring now to FIG. 23, the difference between the propagation constant of the beam traveling on the diffraction grating waveguides 6a, 6b and the propagation constant of the beam traveling on the connecting waveguide 7 depends upon a difference ($n_0 - n_1$) between an effective refractive index $n_1$ of the connecting waveguide 7 and an average effective refractive index $n_0$ of the diffraction grating waveguides 6a, 6b.

Further, the difference ($n_0 - n_1$) in the effective refractive index depends upon a difference ($h_0 - h_1$) between a thickness $h_1$ of the connecting waveguide 7 and an average thickness $h_0$ which is derived while taking into account a depth of grooves existing between the respective diffraction gratings of the diffraction grating waveguides 6a, 6b.

In other words, in order for the amount of phase shift of the beam that travels on the connecting waveguide 7 to be close to $\pi$ multiplied by a half value of an odd integer ($\pi/2$, $3\pi/2$, $5\pi/2$, . . . ), accurate control must be made on the difference ($h_0-h_1$).

Each of the gratings in the diffraction grating waveguides 6a, 6b of this DFB semiconductor laser is generally formed by etching.

Specifically, the average thickness $h_0$ of the diffraction grating waveguides 6a, 6b depends upon the depth of grooves formed by etching, and therefore, depends upon accuracy of the etching performed in the process of manufacturing the DFB semiconductor laser.

As a result, it is impossible to provide accurate control on the amount of the phase shift of the beam that travels on the connecting waveguide 7, and there is a problem that the manufactured DFB semiconductor laser has a low probability for oscillation at a single wavelength, which means that product yield is low in the manufacture.

Further, since the thickness $h_1$ of the connecting waveguide 7 is constant, and the average thickness $h_0$ of the diffraction grating waveguides 6a, 6b is also constant, the difference ($h_0-h_1$) is constant.

As a result, the length L of the connecting waveguide 7 is determined to a substantially fixed value for the amount of phase shift of the beam that travels on the connecting waveguide 7 to have a value equal to $\pi$ multiplied by a half value of an odd integer ($\pi/2$, $3\pi/2$, $5\pi/2$, . . . ).

Further, according to the conventional DFB semiconductor laser shown in FIG. 22, the difference ($n_0-n_1$) has a constant value due to a fixed difference in cross-sectional shape between the connecting waveguide 7 and the diffraction grating waveguides 6a, 6b.

As a result, with the beam wavelength $\lambda_0$ being $2\pi$, the length L of the connecting waveguide must be set so as to be closest to one of the values given by $\pi$ multiplied by a half value of an odd integer ($\pi/2$, $3\pi/2$, $5\pi/2$, . . . ), which means that the value of length L of the connecting waveguide cannot be selected optionally.

Now, if the length L of the connecting waveguide cannot be selected optionally in the DFB semiconductor laser which has the diffraction grating waveguides 6a, 6b separated from each other in the beam outputting direction, the following problems occur.

First, if the length L of the connecting waveguide cannot be selected freely, this restriction affects the overall size and shape of the DFB semiconductor laser and accordingly, the freedom of the device design is limited.

Second, if the length L of the connecting waveguide is short, intensity of the beam outputted by the DFB semiconductor laser is low.

Specifically, as shown in FIGS. 24A and 24B, if the length L of the connecting waveguide is short, the beam generated in this DFB semiconductor laser has an intensity distribution characteristic represented by a curve which looks somewhat like a mountain or a wave.

This means that beam output intensity $P_0$ of the beam 4 outputted from the two ends of the DFB semiconductor laser is decreased.

Furthermore, since spatial hole burning is induced, degradation of intensity of the outputted beam or beam spectrum width can often be induced.

To the contrary, if the length L of the connecting waveguide is long, the overall size of the DFB semiconductor laser is increased, and the number of devices manufactured per wafer is decreased, so that the manufacturing cost of the device is increased.

Further, if observed in detail, in the DFB semiconductor laser, discontinuity occurs in the effective refractive index n on the boundary surface between the diffraction grating waveguides 6a, 6b and the connecting waveguide 7.

Therefore, part of the beam 4 generated in the active layer 2 and propagated on the diffraction grating waveguides 6a, 6b and the connecting waveguide 7 in the direction of cavity is reflected by this boundary surface.

As a result there is a problem that it is difficult to achieve "single-mode oscillation" described above.

BRIEF SUMMARY OF THE INVENTION

The present invention has been made under the above-described circumstances, and it is therefore an object of the present invention to provide a DFB semiconductor laser in which output beam wavelength can be set to a desired wavelength at a high accuracy, output beam wavelength stability can be improved, and yield in the manufacture can be improved.

Another object of the present invention is to provide a DFB semiconductor laser in which the length of a connecting layer can be set optionally, so that beam intensity of the outputted beam can be increased easily, beam spectral linewidth of the outputted beam can be narrowed, and the level of single-mode oscillation of the outputted beam can be improved.

In order to achieve the above object, according to a first aspect of the present invention, there is provided a distributed feedback semiconductor laser comprising:

a semiconductor substrate (11);

first and second diffraction grating layers (12a, 12b) provided above the semiconductor substrate and spaced from each other in an output direction of a beam (23) so as to configure part of a virtual diffraction grating (16) having a constant grating pitch and a continuous phase;

a flat connecting layer (13) sandwiched between the first and second diffraction grating layers (12a, 12b);

an active layer (18) disposed above or below the first and second diffraction grating layers and the connecting layer; and a cladding layer (19) disposed above the active layer, wherein the diffraction grating of the first and second diffraction grating layers have a plurality of slits (15) penetrating from an upper surface to a lower surface and perpendicular to the output direction of the beam, and the connecting layer is formed from two layers (13a, 13b) grown epitaxially in a direction perpendicular to the output direction of the beam, one (13a) of the two layers being formed of the same material as the first and second diffraction grating layers.

In the DFB semiconductor laser according to the first aspect described above, the diffraction gratings in the first and second diffraction grating layers have a plurality of slits penetrating from an upper surface to a lower surface and perpendicular to the output direction of the beam.

Commonly, a diffraction grating includes a plurality of bars and a plurality of grooves between the bars.

However, in the DFB semiconductor laser according to the first aspect, each groove between the bars is formed by a slit penetrating from the upper to the lower surfaces.

Such a structure in which the groove between the bars is constituted by the slit leads to accuracy improvement of shape and size when the diffraction grating is formed by means of etching.

The connecting layer sandwiched between the first and second diffraction grating layers corresponds to the connecting waveguides in the conventional DFB semiconductor laser. The connecting layer includes two layers, and one of the two layers is formed of the same material as the first and second diffraction grating layers. Therefore, the average effective refractive index of the connecting layer can be varied by adjusting the thickness ratio among the layers.

As a result, the length L of the connecting layer can be set desirably long, to a value which makes the amount of phase shift of the beam traveling on the connecting layer exactly equal to $\pi$ multiplied by half of an odd integer ($\pi/2$, $3\pi/2$, $5\pi/2$ ... ).

With the above, the length L of the connecting layer can be set to 100 µm or greater, for example.

Thus, by giving a large value to the distance L of the connecting layer, it becomes possible to make the beam generated in the DFB semiconductor laser have a gentle beam-intensity distribution curve, and thereby reduce unwanted decrease in the output intensity of the beam outputted from the two ends of the DFB semiconductor laser.

The connecting layer is formed from two layers grown epitaxially in the direction perpendicular to the output direction of the beam, and one of the two layers is formed of the same material as the first and second diffraction grating layers.

Thus, it is possible to avoid formation of a boundary surface which may wildly alter the effective refractive index in the DFB semiconductor laser. Accordingly, it becomes possible to improve single-mode oscillation of the beam outputted from the two facets of the DFB semiconductor laser.

In order to achieve the above object, according to a second aspect of the present invention, there is provided a distributed feedback semiconductor laser comprising:

a semiconductor substrate (11);

an active layer (18) disposed above the semiconductor substrate;

first and second diffraction grating layers (12a, 12b) provided above the active layer and spaced from each other in an output direction of a beam (23) so as to configure part of a virtual diffraction grating having a constant grating pitch and a continuous phase;

a flat connecting layer (13) sandwiched between the first and second diffraction grating layers; and a cladding layer (19) disposed above the first and second diffraction grating layers and the connecting layer, wherein a diffraction grating of each of the first and second diffraction grating layers has a plurality of slits (15) penetrating from an upper surface to a lower surface and perpendicular to the output direction of the beam, and the connecting layer is formed from two layers (13a, 13b) grown epitaxially in a direction perpendicular to the output direction of beam, one (13a) of the two layers being formed of the same material as the first and second diffraction grating layers.

In the DFB semiconductor laser according to the second aspect as described above, the diffraction gratings of the first and second diffraction grating layers have a plurality of slits penetrating from an upper surface to a lower surface and perpendicular to the output direction of the beam.

Further, the diffraction gratings of the first and second diffraction grating layers include two layers, and one of the two layers is formed of the same material as the first and second diffraction grating layers.

In the DFB semiconductor laser according to the first aspect, the first and second diffraction grating layers are disposed below the active layer. On the contrary, in the DFB semiconductor laser according to the second aspect, the first and second diffraction grating layers are disposed above the active layer.

Other configuration of the DFB semiconductor laser according to the second aspect is similar to that of the DFB semiconductor laser according the first aspect.

Therefore, the DFB semiconductor laser according to the second aspect can offer generally the same functions and advantages as offered by the DFB semiconductor laser according to the first aspect.

Note that, in the case where the diffraction grating layers are provided below the active layer, when an n-type semiconductor substrate is used, there is no need to re-grow a boundary surface on the side of p. Thus, it becomes possible to eliminate characteristic degradation caused by piling up of Si.

When the diffraction grating layers are provided above the active layer, there is an advantage that the active layer can be grown first and then the grating pitch (pitch) in the diffraction gratings can be set. Further, the number of layers to be grown is fewer by one.

In order to achieve the above object, according to a third aspect of the present invention, there is provided a distributed feedback semiconductor laser comprising:

a semiconductor substrate (111);

first and second diffraction grating layers (112a, 112b) provided above the semiconductor substrate and spaced from each other in an output direction of a beam (123);

a connecting layer (113) sandwiched between the first and second diffraction grating layers;

an active layer (118) disposed above the first and second diffraction grating layers and the connecting layer; and a cladding layer (119) disposed above the active layer, wherein a first diffraction grating (116a) which configures the first diffraction grating layer and a second diffraction grating (116b) which configures the second diffraction grating layer have a same grating pitch (d), and a phase of grating arrangement is shifted spatially between the first diffraction grating and the second diffraction grating.

In the DFB semiconductor laser according to the third aspect, the first diffraction grating and the second diffraction grating which are spaced from each other in the outputting direction of the beam have virtually the same grating pitch (pitch), but their phases are shifted from each other instead of being continuous.

In other words, even if the first diffraction grating and the second diffraction grating are continuous and not spaced from each other, due to presence of the three-dimensional phase shift, phase of the beam that propagates on the first and second diffraction grating layers is shifted by the given amount of phase shift.

As described above, when the first diffraction grating layer and the second diffraction grating layer are spaced from each other to sandwich a connecting layer on which a diffraction grating is not formed, phase of the beam that propagates on the first and second diffraction grating layers can be shifted.

The amount of phase shift of the beams is determined by the difference in propagation constants of the first and second diffraction grating layers and the connecting layer (connecting waveguide), and the length L of the connecting layer.

As described above, the amount of phase shift of the beam that propagates on the first and second diffraction grating layers may be close to $\pi$ multiplied by half of an odd integer ($\pi/2$, $3\pi/2$, $5\pi/2$ ... ).

Therefore, by adjusting the amount of three-dimensional phase shift between the first diffraction grating and the second diffraction grating, and the difference in cross-sectional shape between the first and second diffraction grating layers and the connecting layer, it is possible to set a plurality of values for the length L of the connecting layer that makes the amount $\phi$ of the phase shift of the propagating beam exactly equal to $\pi$ multiplied by half of an odd integer ($\pi/2$, $3\pi/2$, $5\pi/2$ ... ).

In other words, according to this DFB semiconductor laser, the length L of the connecting layer can be set generally freely.

Therefore, by setting a large value for the length L of the connecting layer, it is possible to suppress spatial hole burning, to generate beam at a high efficiency when a high current is applied, and thereby to increase efficiency of this DFB semiconductor laser.

The term "phase shift" as used herein is introduced in order to complement a structural restraint in which the amount of phase shift in the beam caused by a difference in propagation constant between the diffraction grating region and the flat connecting layer falls off the desired value of $\pi/2$.

Therefore, the amount of phase shift of the beam caused by the difference in propagation constant is not limited to $\pi/2$ or neighborhood values.

When high output or narrow spectrum characteristic of the device is high in priority, it is desirable that the flat connection layer is given a length as large as possible. Therefore, the amount of phase shift of the beam caused by the difference in propagation constant becomes unavoidably greater than $\pi/2$.

In this case, a negative phase shift is introduced in the diffraction grating, so that disadvantages due to the amount of phase shift of the beam caused by the difference in propagation constant being greater than $\pi/2$ can be offset.

On the other hand, when mass manufacture at a low cost is high in priority, it is desirable to increase the number of chips (yield) to be produced per wafer. To achieve this, the length of the chip must be short.

Obviously, the length of the connecting layer cannot exceed the length of chip. Therefore, if the amount of phase shift of the beam caused by the difference in propagation constant is smaller than $\pi/2$, it is possible to compliment the situation by introducing a positive phase shift into the diffraction grating.

In these ways, a wide range of freedom is offered in device design, enabling to meet various requirements.

In order to achieve the above object, according to a fourth aspect of the present invention, there is provided a distributed feedback semiconductor laser comprising:

a semiconductor substrate (111);

an active layer (118) disposed above the semiconductor substrate;

first and second diffraction grating layers (112a, 112b) provided above the active layer and spaced from each other in an output direction of a beam (123);

a connecting layer (113) sandwiched between the first and second diffraction grating layers; and a cladding layer (119) disposed above the first and second diffraction grating layers and the connecting layer, wherein a first diffraction grating (116a) which configures the first diffraction grating layer and a second diffraction grating (116b) which configures the second diffraction grating layer have a same grating pitch (d), and a phase of grating arrangement is shifted spatially between the first diffraction grating and the second diffraction grating.

In the DFB semiconductor laser according to the fourth aspect as described, the first and second diffraction grating layers are disposed above the active layer, while in the DFB semiconductor laser according to the third aspect, the first and second diffraction grating layers are disposed below the active layer.

Other configuration of the DFB semiconductor laser according to the fourth aspect is similar to the DFB semiconductor laser according the third aspect.

Therefore, the DFB semiconductor laser according to the fourth aspect can offer generally the same functions and advantages as offered by the DFB semiconductor laser according to the third aspect.

Note that, in the case where the diffraction grating layers are formed below the active layer, when an n-type semiconductor substrate is used, there is no need to re-grow a boundary surface on the side of p. Thus, it becomes possible to prevent characteristic degradation caused by piling up of Si.

When the diffraction grating layers are formed above the active layer, there is an advantage that the active layer can be grown first and then the grating pitch (pitch) in the diffraction gratings can be set. Further, the number of layers to be grown is fewer by one.

In order to achieve the above object, according to a fifth aspect of the present invention, there is provided a distributed feedback semiconductor laser according to any one of the first to fourth aspects, wherein a coupling efficiency ($\kappa_1$) in the diffraction grating (16a, 116a) of the first diffraction grating layer (12a, 112a) and a coupling efficiency ($\kappa_2$) in the diffraction grating (16b, 116b) of the second diffraction grating layer (12b, 112b) are set values different from each other.

The DFB semiconductor laser according to the fifth aspect is the DFB semiconductor laser according to the first to fourth aspects, in which a coupling efficiency $\kappa_1$ in the diffraction grating of the first diffraction grating layer and a coupling efficiency $\kappa_2$ in the diffraction grating of the second diffraction grating layer are set values different from each other.

The term coupling efficiency $\kappa$ used herein is an index indicating the degree of coupling between the forward wave and the backward wave propagating on a diffraction grating.

A high coupling efficiency $\kappa$ indicates that a beam propagating on the diffraction grating has a strong tendency to be converted from forward wave to backward wave.

Likewise, a low coupling efficiency $\kappa$ indicates a low tendency for the beam propagating on the diffraction grating to be converted from forward wave to backward wave.

For example, the coupling efficiency $\kappa$ tends to become lower as a ratio between the volume of bars and the volume of other parts including the slits increases in the diffraction grating in the waveguide.

Likewise, the coupling efficiency $\kappa$ tends to become lower as a difference between the refractive index of bars and the refractive index of other parts including the slits decreases in the diffraction grating.

A difference between the coupling efficiency $\kappa_1$ in the diffraction grating of the first diffraction grating layer and the coupling efficiency $\kappa_2$ in the diffraction grating of the second diffraction grating layer means that the rate of beam reflection by the first diffraction grating layer is different from the rate of beam reflection by the second diffraction grating layer.

As a result, it is possible to differentiate the amount of beam outputted from the facet on the side of the first diffraction grating layer from the amount of beam outputted from the facet on the side of the second diffraction grating layer.

Thus, it becomes possible to intentionally raise the intensity of the beam outputted from one facet of the DFB semiconductor laser as compared with the intensity of the beam outputted from the other facet.

In order to achieve the above object, according to a sixth aspect of the present invention, there is provided a distributed feedback semiconductor laser according to any one of the first to fifth aspects, wherein the semiconductor substrate is formed of InP, the first and second diffraction grating layers are formed of InGaAsP, the active layer is formed of a material containing InGaAsP, and the cladding layer is formed of InP.

The DFB semiconductor laser according to the sixth aspect is the DFB semiconductor laser according to the fifth aspects, in which the semiconductor substrate is formed of InP, the first and second diffraction grating layers is formed of InGaAsP, the active layer is formed of a material containing InGaAsP, and the cladding layer is formed of InP.

In order to achieve the above object, according to a seventh aspect of the present invention, there is provided a distributed feedback semiconductor laser according to any one of the first to sixth aspects, wherein a refractive index of each bar configuring the first and second diffraction grating layers is set higher than that of the semiconductor substrate, a buffer layer formed of the same material as the semiconductor substrate is formed on an upper or lower surface of the first and second diffraction grating layers and the connecting layer each, and a p-electrode is provided on an upper surface of the cladding layer, and an n-electrode is provided on a lower surface of the semiconductor substrate.

In order to achieve the above object, according to an eighth aspect of the present invention, there is provided a distributed feedback semiconductor laser according to the seventh aspect, wherein selection is made, from a plurality of beams of different wavelengths oscillated from the active layer upon application of a predetermined voltage between the p-electrode and the n-electrode, for a single-mode beam having a single wavelength $\lambda_0$ determined by a grating pitch d of the diffraction grating and an effective refractive index $n_0$ of the first and second diffraction grating layers, whereby a laser oscillation state is achieved, and reflection reducing films are formed on at least one of facets of the active layer from which the single-mode beam is outputted and at least one of facets of the first and second diffraction grating layers, respectively.

In order to achieve the above object, according to a ninth aspect of the present invention, there is provided a distributed feedback semiconductor laser according to the first or second aspect, wherein the other of the two layers in the connecting layer is formed of the same material as the semiconductor substrate.

In order to achieve the above object, according to a tenth aspect of the present invention, there is provided a distributed feedback semiconductor laser according to the third or fourth aspect, wherein the connecting layer is formed from two layers grown epitaxially in a direction perpendicular to the output direction of the beam, one of the two layers being formed of the same material as the first and second diffraction grating layers, the other of the two layers in the connecting layer being formed of the same material as the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

FIG. 9 is a schematic sectional view for explaining a general configuration of a DFB semiconductor laser according to a fourth embodiment of the present invention;

FIG. 10 is a view for explaining a method of setting a length of a connecting layer in the DFB semiconductor laser shown in FIG. 9;

FIG. 11A and FIG. 11B are views for explaining a relationship between the length of the connecting layer and beam intensity distribution characteristic in the DFB semiconductor laser in FIG. 9;

FIG. 12 is a view for explaining beam output characteristic in the DFB semiconductor laser in FIG. 9;

FIG. 13 is a schematic sectional view for explaining a general configuration of a DFB semiconductor laser according to a fifth embodiment of the present invention;

FIG. 14 is a schematic sectional view for explaining a general configuration of a DFB semiconductor laser according to a sixth embodiment of the present invention;

FIG. 20A to FIG. 20C are views for explaining resist patterns for use in forming diffraction gratings of the DFB semiconductor laser according to the tenth embodiment of the present invention;

FIG. 21A to FIG. 21D are views for explaining operation principles of a conventional DFB semiconductor laser;

DETAILED DESCRIPTION OF THE INVENTION

Figure 1:
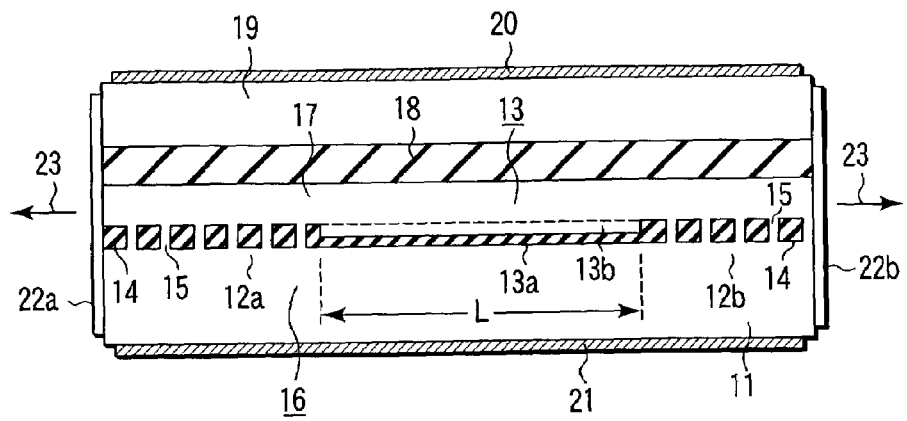
FIG. 1 is a schematic sectional view for explaining a general configuration of a DFB semiconductor laser according to a first embodiment of the present invention.

Reference will now be made in detail to the presently preferred embodiments of the invention as illustrated in the accompanying drawings, in which like reference numerals designate like or corresponding parts.

Hereinafter, embodiments of the present invention will be described with reference to the drawings.

(First Embodiment)

FIG. 1 is a schematic sectional view for explaining a general configuration of a DFB semiconductor laser according to a first embodiment of the present invention.

As shown in FIG. 1, the DFB semiconductor laser according to the first embodiment of the present invention comprises a semiconductor substrate 11 of n-type InP, and a first diffraction grating layer 12a of n-type InGaAsP, a connecting layer 13, and a second diffraction grating layer 12b of n-type InGaAsP are formed on an upper surface of the semiconductor substrate 11.

Each of the first and second diffraction grating layers 12a, 12b includes a plurality of bars 14 and a plurality of slits 15 existing between the bars.

In this case, all the bars 14 and all the slits 15 included in the first and second diffraction grating layers 12a, 12b configure a virtual diffraction grating 16 that has a constant grating pitch (pitch) and a continuous phase.

A refractive index of the bars 14 which configure the first and second diffraction grating layers 12a, 12b is set to be greater than that of the semiconductor substrate 11.

The connecting layer 13, which fills the spatial between the first and second diffraction grating layers 12a, 12b, includes a lower layer 13a formed of the same material as the first and second diffraction grating layers 12a, 12b, and an upper layer 13b formed of the same material as the semiconductor substrate 11.

A buffer layer 17 of the same material as the semiconductor substrate 11 is formed on upper surfaces of the first and second diffraction grating layers 12a, 12b, and the connecting layer 13.

The lower layer 13b of the connecting layer 13 and the buffer layer 17 are formed integrally with each other.

The buffer layer 17 has an upper surface formed with an active layer 18 including a lower SCH (Separated Confinement Heterostructure) layer, a MQW (Multi-Quantum Well) layer, and an upper SCH layer, each made of an appropriate combination of InGaAsP.

A cladding layer 19 of p-type InP is formed on an upper surface of the active layer 18.

A p-electrode 20 is provided on an upper surface of the cladding layer 19, and an n-electrode 21 is formed on an upper surface of the semiconductor substrate 11.

Further, reflection reducing films 22a, 22b are formed on facets of the active layer 18 from which a single-mode beam 23 is outputted, and facets of the first and second diffraction grating layers 12a, 12b.

Note that a contact layer formed of p-type InGaAsP or p-type InGaAs can be interposed between the cladding layer 19 and the p-electrode 20.

In the DFB semiconductor laser according to the first embodiment configured as above, the active layer 18 emits a beam having multiple of wavelengths when a predetermined current is injected between the p-electrode 20 and the n-electrode 21.

Figure 2:
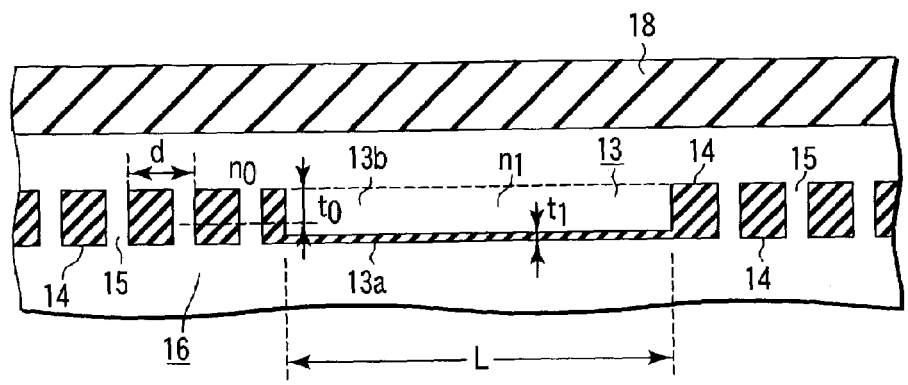
FIG. 2 is a view for explaining a method of setting a length of a connecting layer in the DFB semiconductor laser shown in FIG. 1.

A method for setting the length L of the connecting layer 13 in the DFB semiconductor laser according to the first embodiment, is executed as shown in FIG. 2.

When the difference $(n_0-n_1)$ in the effective refractive index, i.e. the difference $(t_0-t_1)$ between the average thickness $t_0$ of the first and second diffraction grating layers 12a, 12b and the thickness $t_1$ of the upper layer 13a, is smaller, the length L of the connecting layer 13 is longer.

By increasing the length L of the connecting layer 13, it becomes possible to increase the intensity of the beam 23 outputted from this DFB semiconductor laser, and to narrow the spectrum width.

Figure 3A:
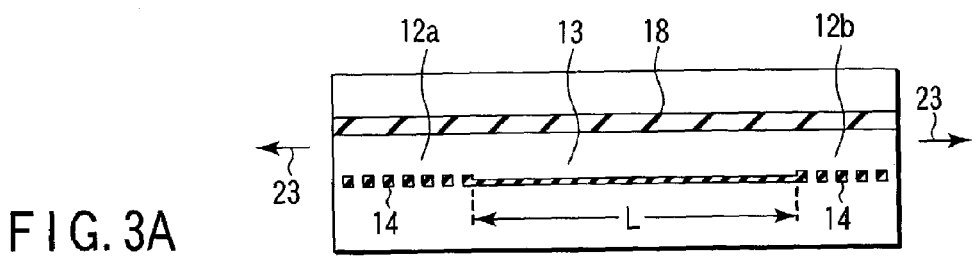
FIG. 3A and FIG. 3B are views for explaining a relationship between the length of the connecting layer and beam intensity distribution characteristic in the DFB semiconductor laser shown in FIG. 1.
Figure 3B:

Thus, as shown in FIG. 3A and FIG. 3B, by giving a large value to the distance L of the connecting layer 13, the beam 23 which goes back and fourth within the DFB semiconductor laser has an intensity distribution characteristic 24 represented by a curve having a wide plateau in the middle portion, resulting in reduced spatial hole burning, increased output and narrow spectrum width.

Figure 4:
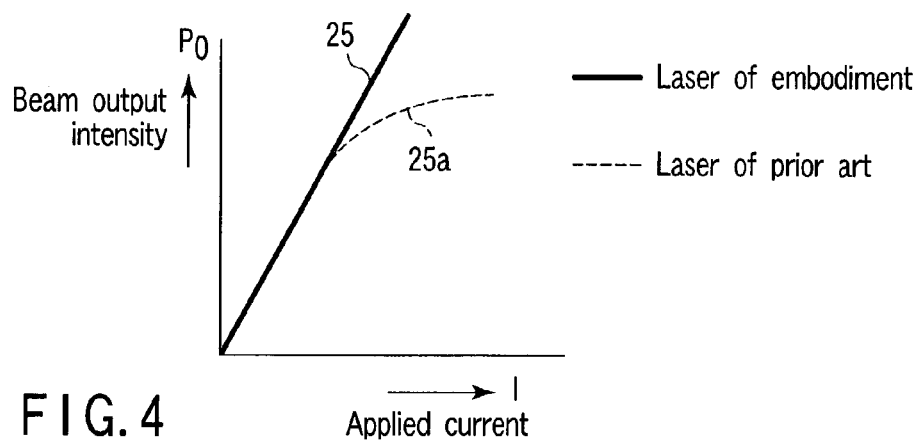
FIG. 4 is a view for explaining beam output characteristic in the DFB semiconductor laser in FIG. 1.

Further, as shown in FIG. 4, it becomes possible to improve an output characteristic 25 of the beam with respect to the applied current. Specifically, the linear response can be improved as compared to an output characteristic 25a of the conventional DFB semiconductor laser.

Further, since the upper layer 13a of the connecting layer 13 is formed of the same material as the first and second diffraction grating layers 12a, 12b, the effective refractive index $n_1$ of the connecting layer 13 does not greatly differ from the effective refractive index $n_0$ of the first and second diffraction grating layers 12a, 12b.

As a result, there is no wide variation in terms of effective refractive index on the boundary surface between the connecting layer 13 and the first and second diffraction grating layers 12a, 12b. Therefore, reflection of the beam 23 is suppressed at the boundary surface, and thus it becomes possible to suppress composite resonance, thereby to improve the single-mode oscillation.

In addition, the diffraction grating 16 provided by the first and second diffraction grating layers 12a, 12b has a plurality of slits 15 penetrating from upper to the lower surfaces and is perpendicular to the output direction of the beam.

Commonly, a diffraction grating includes a plurality of bars and a plurality of grooves existing between the bars. However, according to the present embodiment, each groove between the bars 14 is formed by a slit 15 penetrating from the upper to the lower surfaces.

Such a structure that the groove between each pair of bars 14 is provided by a slit 15 leads to accuracy improvement of shape and size when the diffraction grating is formed by means of etching.

Specifically, inconsistency in the effective refractive index $n_0$ of the first and second diffraction grating layers 12a, 12b among the devices is reduced, and the value settles down to a fixed range.

This improves accuracy in the amount of phase shift $\phi$, resulting in improved wavelength stability of the outputted beam 23.

Note that, in the DFB semiconductor laser according to the first embodiment, the first and second diffraction grating layers 12a, 12b are disposed below the active layer 18. Therefore, there is no need, when an n-type semiconductor substrate is used, to re-grow a surface on the side of p. Thus, it is possible to eliminate characteristic degradation caused by piling up of Si.

(Second Embodiment)

Figure 5:
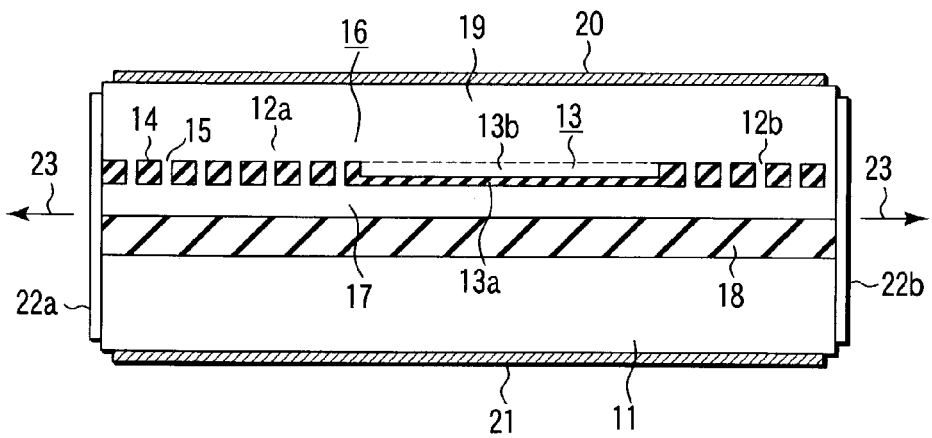
FIG. 5 is a schematic sectional view for explaining a general configuration of a DFB semiconductor laser according to a second embodiment of the present invention.

FIG. 5 is a schematic sectional view for explaining a general configuration of a DFB semiconductor laser according to a second embodiment of the present invention.

In FIG. 5, components identical with those in the DFB semiconductor laser according to the first embodiment shown in FIG. 1 are given the same reference codes and their description will not be duplicated here.

As shown in FIG. 5, the DFB semiconductor laser according to the second embodiment of the present invention comprises a semiconductor substrate 11 of n-type InP, which has an upper surface formed with an active layer 18 including a lower SCH layer, a MQW layer, and an upper SCH layer, each made of an appropriate combination of InGaAsP.

A buffer layer 17 made of the same material as a cladding layer 19 is formed on an upper surface of the active layer 18.

A first diffraction grating layer 12a of p-type InGaAsP, a connecting layer 13, and a second diffraction grating layer 12b of p-type InGaAsP are formed on an upper surface of the buffer layer 17.

Each of the first and second diffraction grating layers 12a, 12b includes a plurality of bars 14 and a plurality of slits 15 existing between the bars.

With the above, all the bars 14 and all the slits 15 included in the first and second diffraction grating layers 12a, 12b configure a virtual diffraction grating 16 that has a constant grating pitch (pitch) and a continuous phase.

A refractive index of the bars 14 which configure the first and second diffraction grating layers 12a, 12b is set to be greater than that of the cladding layer 19.

The connecting layer 13, which fills the spatial between the first and second diffraction grating layers 12a, 12b, includes a lower layer 13a formed of the same material as the first and second diffraction grating layers 12a, 12b, and an upper layer 13b formed of the same material as the cladding layer 19.

The cladding layer 19 made of p-type InP is formed on upper surfaces of the first and second diffraction grating layers 12a, 12b, and the connecting layer 13.

The lower layer 13b of the connecting layer 13 and the cladding layer 19 are formed integrally with each other.

A p-electrode 20 is provided on the cladding layer 19, and an n-electrode 21 is provided on a lower surface of the semiconductor substrate 11.

Further, reflection reducing films 22a, 22b are formed on facets of the active layer 18 from which a single-mode beam 23 is outputted, and facets of the first and second diffraction grating layers 12a, 12b.

Note that a contact layer of p-type InGaAsP or p-type InGaAs can be interposed between the cladding layer 19 and the p-electrode 20.

In the DFB semiconductor laser according to the second embodiment configured as above, the active layer 18 emits a beam having multiple wavelengths when a predetermined current is injected between the p-electrode 20 and the n-electrode 21.

Therefore, the DFB semiconductor laser according to the second embodiment has the same capability as the DFB semiconductor laser according to the first embodiment in that the length L of the connecting layer 13 in the propagation direction of the beam 23 can be set desirably longer. Thus, the DFB semiconductor laser according to the second embodiment can offer generally the same functions and advantages as achieved by the DFB semiconductor laser shown in FIG. 1.

It should be noted that in the DFB semiconductor laser according to the second embodiment, the first and second diffraction grating layers 12a, 12b are disposed above the active layer 18. For this reason, only one cycle of growth is necessary for formation of the active layer 18 through the first and second diffraction grating layers 12a, 12b, which offers an advantage that the number of layers to be grown is fewer by one.

Further, the active layer 18 can be grown first, and then the grating pitch (pitch) in the diffraction grating of the first and second diffraction grating layers 12a, 12b can be set.

(Third Embodiment)

Figure 6:
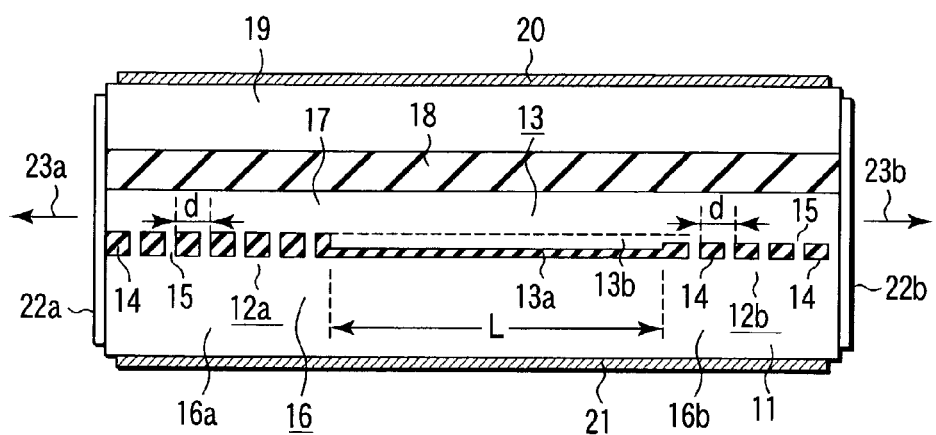
FIG. 6 is a schematic sectional view for explaining a general configuration of a DFB semiconductor laser according to a third embodiment of the present invention.

FIG. 6 is a schematic sectional view for explaining a general configuration of a DFB semiconductor laser according to a third embodiment of the present invention.

In FIG. 6, components identical with those in the DFB semiconductor laser according to the first embodiment shown in FIG. 1 are given the same reference codes and their description will not be duplicated here.

As shown in FIG. 6, in the DFB semiconductor laser according to the third embodiment of the present invention, a coupling efficiency $\kappa_1$ in a diffraction grating 16a of a first diffraction grating layer 12a and a coupling efficiency $\kappa_2$ in a diffraction grating 16b of a second diffraction grating layer 12b is set to values different from each other.

Further, in the DFB semiconductor laser according to the third embodiment of the present invention, a volume ratio $v_1$ per grating pitch d in the diffraction grating 16a of the first diffraction grating layer 12a, which is a ratio between the volume of bar 14 and the volume of the other parts including the slit 15 is a different value from that of a volume ratio $v_2$ in the diffraction grating 16b of the second diffraction grating layer 12b.

Since the bars 14 and the slits 15 of the first and the second diffraction gratings 16a, 16b in the first and second diffraction grating layers 12a, 12b are formed respectively of the same material, the volume ratios $v_1$ and $v_2$ control respectively to the coupling efficiencies $\kappa_1$ and $\kappa_2$, if influences caused by refractive index are neglected.

Specifically, the first and second diffraction grating layers 12a, 12b which are spaced from each other by the connecting layer 13 configure part of the virtual diffraction grating 16 having a constant grating pitch (pitch) d and continuous phase, but the first and the second diffraction gratings 16a, 16b provided respectively by the first and second diffraction grating layers 12a, 12b are different from each other in their shape.

In each of the first and the second diffraction gratings 16a, 16b, the grating pitch d includes one bar 14 and one slit (or groove) 15.

With the above, there is defined the predetermined volume ratio v for a grating pitch d as described above, i.e. the ratio between the volume of the bar 14 and the volume of the parts other than the bar 14 including the slit 15.

In this case, the volume ratio v is determined by the width of the bar in the proceeding direction of beam 23, the height of the bar 14, the width of the bar 14 perpendicular to the proceeding direction of beam 23 and so on.

According to the embodiment in FIG. 6, the height of the bar 14 in the proceeding direction of beam 23 is given a greater value in the diffraction grating 16a of the first diffraction grating layer 12a than the height of the bar 14 in the proceeding direction of the beam 23 in the diffraction grating 16b of the second diffraction grating layer 12b. In this way, the volume ratio $v_1$ for the diffraction grating 16a of the first diffraction grating layer 12a is made different from the volume ratio $v_2$ for the diffraction grating 16b of the second diffraction grating layer 12b; ($v_1 > v_2$).

Therefore, the coupling efficiency $\kappa_1$ of the first diffraction grating layer 12a is different from the coupling efficiency $\kappa_2$ of the second diffraction grating layer 12b. ($\kappa_1 > \kappa_2$).

As a result, the beam reflective index in the diffraction grating 16a of the first diffraction grating layer 12a is different from the beam reflective index in the diffraction grating 16b of the second diffraction grating layer 12a.

This enables to differentiate the strength of beam 23a outputted from the facet on the side of the first diffraction grating layer 12a from the strength of beam 23b outputted from the facet on the side of second diffraction grating layer 12b.

Thus, it becomes possible to intentionally raise the intensity of the beam outputted from one facet of the DFB semiconductor laser as compared to the intensity of the beam outputted from the other facet.

According to the embodiment in FIG. 6, the intensity of the beam 23b outputted from the facet on the side of the second diffraction grating layer 12b is set to be greater than the intensity of the beam 23a outputted from the facet on the side of the first diffraction grating layer 12a.

Note that, according to the embodiment in FIG. 6, the intensity of the beam 23b outputted from the facet on the side of the second diffraction grating layer 12b is made greater by giving a smaller reflective index to the reflection reducing coating 22b formed on the facet of the second diffraction grating layer 12b than a reflective index given to the reflection reducing coating 22a formed on the facet of the first diffraction grating layer 12a.

In this case, the reflection reducing coating 22a formed on the facet on the side of the first diffraction grating layer 12a may be a high reflection coating or may be left as a facet.

Note that the coupling efficiency $\kappa_1$ in the diffraction grating 16a of the first diffraction grating layer 12a can be differentiated from the coupling efficiency $\kappa_2$ in the diffraction grating 16b of the second diffraction grating layer 12.

FIG. 7A to FIG. 7H are views for explaining steps in manufacturing the DFB semiconductor laser in which the volume ratio $v_1$ (coupling efficiency $\kappa_1$) for the diffraction grating 16a of the first diffraction grating layer 12a is differentiated from the volume ratio $v_2$ (coupling efficiency $\kappa_2$; $\kappa_1 < \kappa_2$) for the diffraction grating 16b of the second diffraction grating layer 12b. The views illustrate steps up to formation of the first and the second diffraction gratings 16a, 16b.

Hereinafter, with reference to FIG. 7A to FIG. 7H, description will be made for such a DFB semiconductor laser according to the third embodiment shown in FIG. 6, i.e. a case in which the first and second diffraction grating layers 12a, 12b are formed below the active layer 18.

Figure 7A:
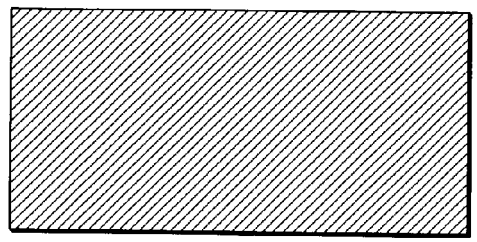
FIG. 7A to FIG. 7H are views for explaining a method of manufacturing the DFB semiconductor laser according to the third embodiment of the present invention.
Figure 7B:
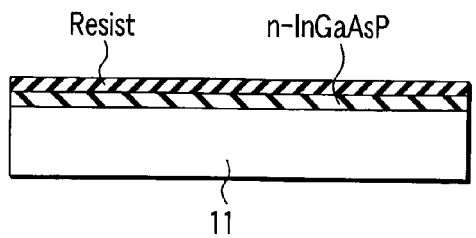

First, as shown in FIG. 7A and FIG. 7B, first and second diffraction grating layers 12a, 12b are formed on a semiconductor substrate 11 of n-type InP. A layer of n-type InGaAsP for generation at 1.08-µm wavelength is grown to a thickness of 0.1 µm. On this layer, an electron beam resist (e.g. ZEP-520 manufactured by Zeon Corporation) is applied to a thickness of 0.2 µm.

After heat treatment, diffraction grating pattern drawing is performed by means of electron beam lithography.

Figure 7C:
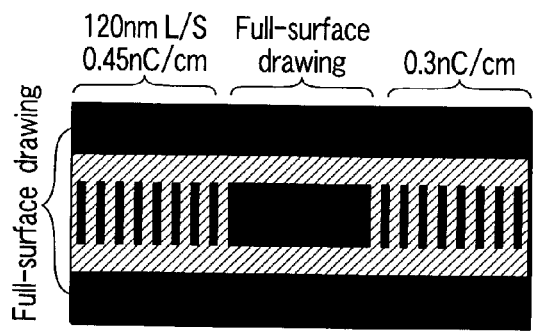
Figure 7D:
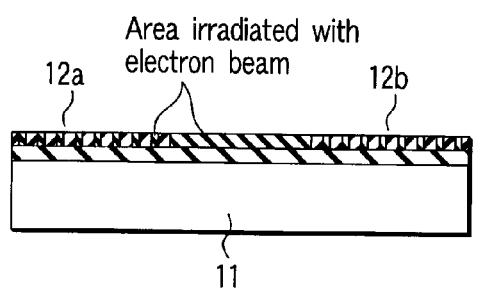

FIG. 7C and FIG. 7D show a drawing pattern and drawing conditions according to the third embodiment, where the grating pitch (pitch) d of the diffraction gratings 16a, 16b is set to 240 nm.

The drawing conditions include that a relatively large dosage (e.g. about 0.45 nC/cm) is used for the first diffraction grating layer 12a (left side in FIG. 7C and FIG. 7D) serving as the outputting side when the chip is processed, whereas a relatively small dosage (e.g. about 0.3 nC/cm) is used for the second diffraction grating layer 12b on the other side, thereby the electron beam is irradiated.

In this case, surrounding regions may be exposed by the electron beam or ultraviolet rays.

The diffraction grating pattern thus drawn is then developed.

Figure 7E:
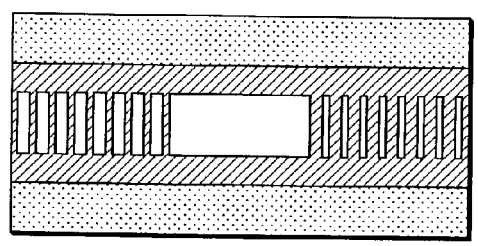
Figure 7F:
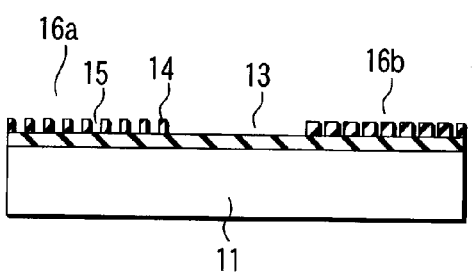

As shown in FIG. 7E and FIG. 7F, according to the third embodiment, the resist pattern after the development gives a predetermined slit 15 of about 140 nm for a region with a high dosage and about 70 nm for a region with a low dosage, between each pair of bars 14 in the first and the second diffraction gratings 16a, 16b.

Etching is performed in this state for about 20 seconds by using a water solution of saturated bromine water and phosphoric acid.

Figure 7G:
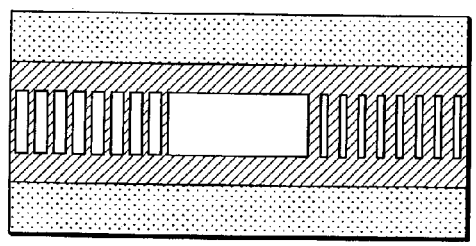
Figure 7H:
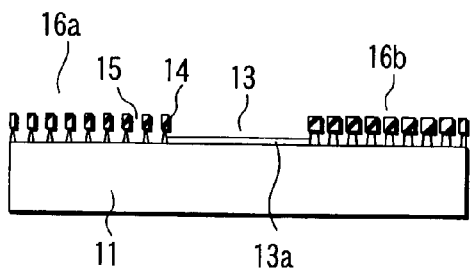

Then, cross-sectional shapes as shown in FIG. 7G and FIG. 7H are obtained. Due to heating in the subsequent crystal growth step, the difference in width of the bars 14 is transferred into the difference in height of the bars 14.

Thus, manufacture is carried out for a DFB semiconductor laser having a structure in which the volume ratio $v_1$ of the diffraction grating 16a on the beam outputting side is small while the volume ratio $v_2$ of the diffraction grating 16b on the other side; ($v_1 < v_2$).

In a connecting layer 13 in the middle, its entire resist is removed. For this reason, the etching rate for this region is the lowest, leaving a thin n-type InGaAsP layer as a lower layer 13b.

On the other hand, as other methods than changing the dosage, it is possible to utilize a phenomenon that the etching rate at etching varies depending on the exposed area of the wafer.

Specifically, when an area of the wafer surface covered with etching inhibitors such as a resist, or dielectric coating is large, and an area to be etched is small, the etching rate is high. On the other hand, the etching rate is low when a large area is etched. This phenomenon is commonly known in the use of the above-mentioned water solution of saturated bromine water and phosphoric acid, for example.

Figure 8A:
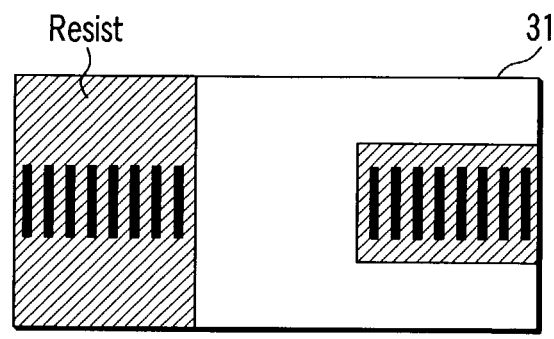
FIG. 8A to FIG. 8C are views for explaining resist patterns for use in forming diffraction gratings of the DFB semiconductor laser according to the third embodiment of the present invention.
Figure 8B:
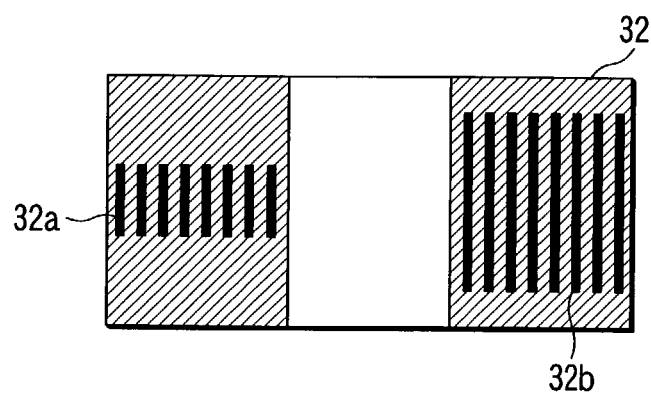
Figure 8C:
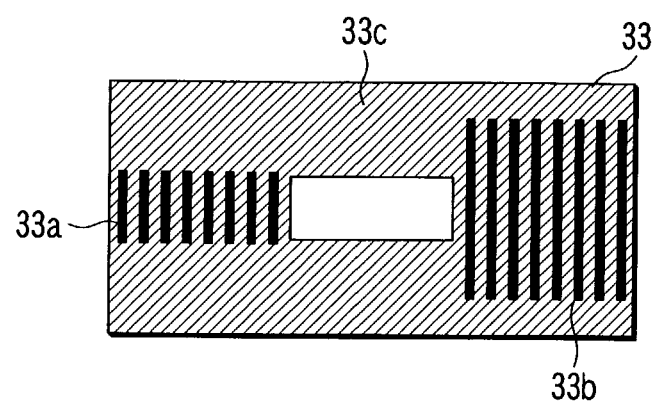

By utilizing this characteristic, when resist patterns 31, 32, 33 as shown in FIG. 8A, FIG. 8B and FIG. 8C are formed, it is possible to partially form the diffraction gratings having different volume ratios v.

As shown in FIG. 8A, the etching rate becomes lower when etching is performed after removing a surrounding resist 31a of the resist pattern 31.

In this case, even when electron beam lithography is not used, manufacture is possible in the interferometric exposure method.

As shown in FIG. 8B, the etching rate can be controlled by changing the width of grating patterns 32a, 32b (e.g. 20 μm for the grating pattern 32a, and 100 μm for the grating pattern 32b) in the direction perpendicular to the beam propagation direction in the resist pattern 32.

Further, the residual thickness of the n-type GaAsP (the thickness of the lower layer 13a) of the connecting layer 13 can be controlled as shown in FIG. 8C, by not removing, but leaving a surrounding resist 33c of the resist pattern 33 as part of the etching mask.

Specifically, in this case, the etching rate can be controlled by controlling the exposed area. Therefore, it is possible to control the depth of etching to be completed by the time the diffraction grating has been etched to the InP substrate (about 30 seconds).

In this case, the grating pattern width is differentiated by giving a 20 μm-width to the grating pattern 33a as compared to a 100 μm-width to the grating pattern 33b.

The above description was made for a case of using positive resists. However, the same applies to a case of using negative resists.

Further, in either case, the resist may not necessarily be applied directly on the n-type InGaAsP. For example, an n-type InP layer of 30-nm thickness may be interposed therebetween, and the etching may be performed in two steps, using a selective etchant.

In this case, with the resist serving as the etching mask, etching is made for about 5 seconds in an etchant containing saturated bromine water to remove InP partially.

Then, for the exposed n-type InGaAsP, etching can be performed by using the n-type InP as the etching mask in a water solution containing sulfuric acid and hydrogen peroxide, for example.

According to the above method, the water solution containing sulfuric acid and hydrogen peroxide selectively etches the InGaAsP only. This can work advantageously in the formation of diffraction grating on the active layer in particular, because the etching ceases on the interface of the buffer layer with the InP surface, making possible to prevent unwanted over-etching into the active layer.

As has been described, in the DFB semiconductor lasers according to the first to third embodiments of the present invention, slits are provided between bars of the first and second diffraction grating layers, and part of the connecting layer is formed of the same material as the first and second diffraction grating layers.

Therefore, it is possible to set the wavelength of outputted beam accurately to a desired wavelength, spatial hole burning can be prevented, beam intensity of the outputted beam can be easily increased, improvement can be made in spectrum width and wavelength stability of the outputted beam, and yield in manufacture can be improved.

(Fourth Embodiment)

FIG. 9 is a schematic sectional view for explaining a general configuration of a DFB semiconductor laser according to a fourth embodiment of the present invention.

As shown in FIG. 9, the DFB semiconductor laser according to the fourth embodiment of the present invention comprises a semiconductor substrate 111 of n-type InP, which has an upper surface formed with a first diffraction grating layer 112a of n-type InGaAsP, a connecting layer 113, and a second diffraction grating layer 112b of n-type InGaAsP.

The first diffraction grating layer 112a is formed by a first diffraction grating 116a which includes a plurality of bars 114 and a plurality of slits 115 existing between the bars.

On the other hand, the second diffraction grating layer 112b is formed by a second diffraction grating 116b which includes a plurality of bars 114 and a plurality of slits 115 existing between the bars.

The connecting layer 113, which fills the spatial between the first and second diffraction grating layers 112a, 112b, is formed of the same material as the semiconductor substrate 111.

As shown in FIG. 10, the bars 114 and slits 115 in the first and the second diffraction gratings 116a, 116b are of the same shape respectively, and a grating pitch d between each pair of bars is constant.

However, a phase of grating arrangement is spatially shifted by the distance Δd between the first and the second diffraction gratings 116a, 116b.

This amount of phase shift, Δd, can be freely selected in a process of manufacturing the DFB semiconductor laser, independently from the length L of the connecting layer 113.

A refractive index of each bar 114 in the first and second diffraction grating layers 112a, 112b is set to be higher than that of the semiconductor substrate 111.

A buffer layer 117 of the same material as the semiconductor substrate 111 is formed on upper surfaces of the first and second diffraction grating layers 112a, 112b, and the connecting layer 113.

The connecting layer 113 and the buffer layer 117 are formed integrally with each other.

The buffer layer 117 has an upper surface formed with an active layer 118 including a lower SCH layer, a MQW layer, and an upper SCH layer, each made of an appropriate combination of InGaAsP.

A cladding layer 119 formed of p-type InP is formed on an upper surface of the active layer 118.

A p-electrode 120 is provided on an upper surface of the cladding layer 119, and an n-electrode 121 is provided on a lower surface of the semiconductor substrate 111.

Further, reflection reducing films 122a, 122b are formed on facets of the active layer 118 from which a single-mode beam 123 is outputted, and facets of the first and second diffraction grating layers 112a, 112b.

Note that a contact layer made of p-type InGaAsP or p-type InGaAs can be interposed between the cladding layer 119 and the p-electrode 120.

In the DFB semiconductor laser according to the fourth embodiment configured as the above, the active layer 118 emits a beam having multiple wavelengths when a predetermined current is applied between the p-electrode 120 and the n-electrode 121.

Furthermore, a method of setting the length L of the connecting layer 113 in the DFB semiconductor laser according to the fourth embodiment, is executed as shown in FIG. 10.

Thus, it is possible to arbitrarily set the length L of the connecting layer 113 for this DFB semiconductor laser generally freely by appropriately setting any one of the values given by the π multiplied by a half value of an odd integer, the amount of shift Δd, and the difference ($n_0-n_1$) in the effective refractive index.

Thus, as shown in FIG. 11A and FIG. 11B, by giving a large value to the distance L of the connecting layer 113, the beam 123 generated within the DFB semiconductor laser has an intensity distribution characteristic 124 represented by a curve having a wide plateau in its middle portion and a gentle slope as a whole, resulting in reduced spatial hole burning.

Accordingly, it is possible to reduce output saturation of the device when a high current is applied.

Figure 22:
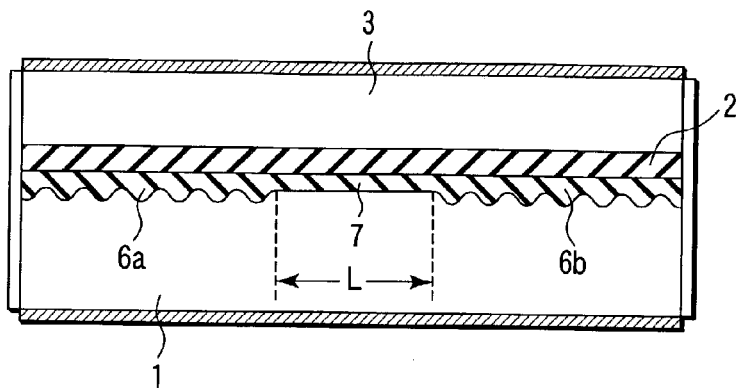
FIG. 22 is a schematic sectional view for explaining a general configuration of the conventional DFB semiconductor laser.
Figure 23:
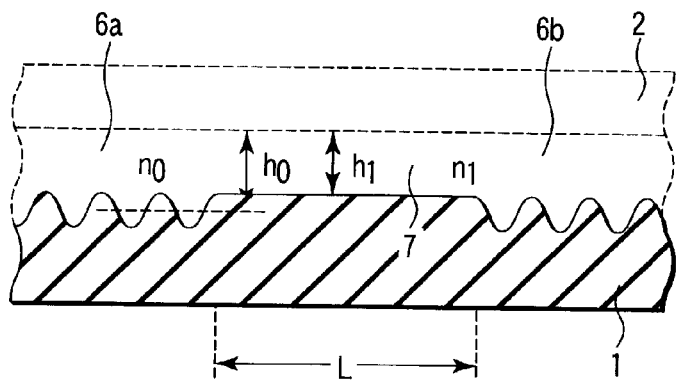
FIG. 23 is a view for explaining a method of setting a length of a connecting waveguide in the conventional DFB semiconductor laser.
Figure 24A:
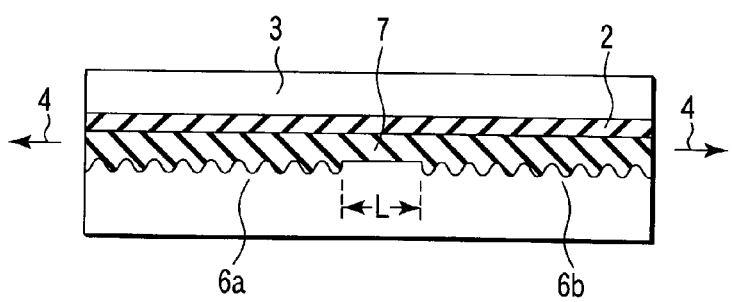
FIG. 24A and FIG. 24B are views for explaining problems in the conventional DFB semiconductor laser.
Figure 24B:
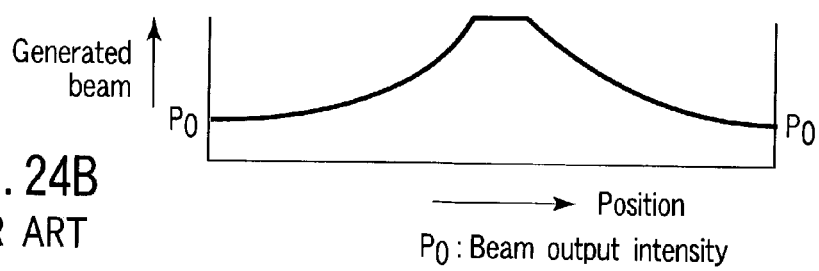

As a result, as shown in FIG. 12, it becomes possible to improve beam output intensity $P_0$ of the beam 123 outputted from two facets of the DFB semiconductor laser significantly higher than beam output intensity $P_0$ of the beam 4 outputted from the conventional DFB semiconductor laser shown in FIG. 22. It is also possible to improve linearity in an output characteristic 125 in response to applied current as compared to an output characteristic 125a of the conventional DFB semiconductor laser.

Further, the connecting layer 113 between the first and second diffraction grating layers 112a, 112b are formed of the same material as the buffer layer 117.

Furthermore, the first and the second diffraction gratings 116a, 116b which configure the first and second diffraction grating layers 112a, 112b, have a plurality of slits 15 penetrating from upper to lower surfaces and perpendicular to the output direction of the beam.

Commonly, a diffraction grating includes a plurality of bars and a plurality of grooves existing between the bars. According to the present embodiment, however, each groove between the bars 114 is formed by a slit 115 penetrating from the upper to the lower surfaces.

Such a structure in which the groove between each pair of bars 114 are formed by the slit 115 leads to accuracy improvement of shape and size when the diffraction grating is formed by means of etching.

Specifically, inconsistency in the effective refractive index $n_0$ of the first and second diffraction grating layers 112a, 112b among the devices is reduced, and the value settles down to a fixed range.

This improves accuracy in the amount of phase shift φ, resulting in improved wavelength stability of the outputted beam 123.

Note that, in the DFB semiconductor laser according to the fourth embodiment, the first and second diffraction grating layers 112a, 112b are disposed below the active layer 118. Therefore, there is no need, when an n-type semiconductor substrate is used, to re-grow a boundary surface on the side of p. Thus, it is possible to eliminate characteristic degradation caused by piling up of Si.

(Fifth Embodiment)

FIG. 13 is a schematic sectional view for explaining a general configuration of a DFB semiconductor laser according to a fifth embodiment of the present invention.

In FIG. 13, components identical with those in the DFB semiconductor laser according to the fourth embodiment in FIG. 9 are given the same reference codes and their description will not be duplicated here.

As shown in FIG. 13, in the DFB semiconductor laser according to the fifth embodiment of the present invention, a connecting layer 113 existing between first and second diffraction grating layers 112a, 112b is formed of the same material as the first and second diffraction grating layers 112a, 112b.

Further, as with the fourth embodiment, an amount of three-dimensional phase shift Δd is provided between a first diffraction grating 116a and a second diffraction grating 116b.

Therefore, the length L of the connecting layer 113 can be freely set by adjusting the amount of phase shift Δd.

Thus, the DFB semiconductor laser according to the fifth embodiment can offer the same advantages as offered by the DFB semiconductor laser according to the fourth embodiment shown in FIG. 9. Specifically, it is possible to create a wide plateau extending for a desirable range in the middle portion of an intensity distribution characteristic curve 124 of a beam 123 generated in the DFB semiconductor laser, and to make a gentle intensity distribution characteristic curve as a whole, and to reduce spatial hole burning.

(Sixth Embodiment)

FIG. 14 is a schematic sectional view for explaining a general configuration of a DFB semiconductor laser according to a sixth embodiment of the present invention.

In FIG. 14, components identical with those in the DFB semiconductor laser according to the fourth embodiment shown in FIG. 9 are given the same reference codes and their description will not be duplicated here.

As shown in FIG. 14, in the DFB semiconductor laser according to the sixth embodiment, a connecting layer 113 existing between first and second diffraction grating layers 112a, 112b is constituted of two layers, i.e. a lower layer 113a and an upper layer 113b.

In this case, the lower layer 113b is formed of the same material as a buffer layer 117 above.

Likewise, the lower layer 113a is formed of the same material as the first and second diffraction grating layers 112a, 112b.

As described, the lower layer 113a of the connecting layer 113 existing between the first diffraction grating layer 112a and the second diffraction grating layer 112b, is formed of the same material as the first and second diffraction grating layers 112a, 112b. Therefore, the effective refractive index is not altered wildly on the boundary surface between the first and second diffraction grating layers 112a, 112b and the connecting layer 113.

As a result, it becomes possible to reduce beam reflection on the boundary surface, thereby to improve further the single-mode oscillation of a beam 123 generated by the DFB semiconductor laser.

Further, as in the fourth embodiment, in the DFB semiconductor laser according to the sixth embodiment, the first diffraction grating 116a and the second diffraction grating 116b have an amount of three-dimensional phase shift Δd.

Therefore, in the DFB semiconductor laser according to the sixth embodiment, the length L of the connecting layer 113 can be selected generally freely as in the fourth and the fifth embodiments.

(Seventh Embodiment)

Figure 15:
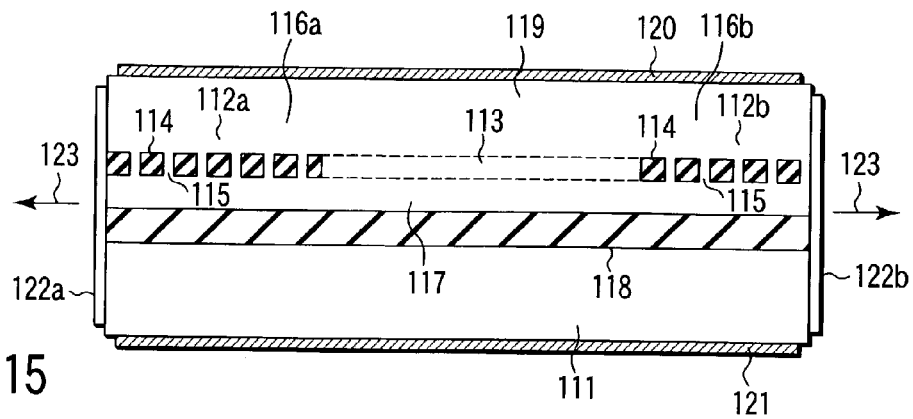
FIG. 15 is a schematic sectional view for explaining a general configuration of a DFB semiconductor laser according to a seventh embodiment of the present invention.

FIG. 15 is a schematic sectional view for explaining a general configuration of a DFB semiconductor laser according to a seventh embodiment of the present invention.

In FIG. 15, components identical with those in the DFB semiconductor laser according to the fourth embodiment shown in FIG. 9 are given the same reference codes and their description will not be duplicated here.

As shown in FIG. 15, the DFB semiconductor laser according to the seventh embodiment of the present invention comprises a semiconductor substrate 111 of n-type InP, which has an upper surface formed with an active layer 118 including a lower SCH layer, a MQW layer, and an upper SCH layer, each made of an appropriate combination of InGaAsP.

A buffer layer 117 formed of the same material as a cladding layer 119 is formed on an upper surface of the active layer 118.

The buffer layer 117 has an upper surface formed with a first diffraction grating layer 112a made of p-type InGaAsP, a connecting layer 113, and a second diffraction grating layer 112b made of p-type InGaAsP.

First and second diffraction gratings 116a, 116b which configure the first and second diffraction grating layers 112a, 112b are formed respectively by a plurality of bars 114 and a plurality of slits 115 existing between the bars. As in the DFB semiconductor laser according to the fourth embodiment, the first diffraction grating 116a and the second diffraction grating 116b have an amount of three-dimensional phase shift Δd.

A refractive index of the bars 114 configuring the first and second diffraction grating layers 112a, 112b is set to be higher than that of the semiconductor substrate 111.

The cladding layer 119 formed of p-type InP is formed on upper surfaces of the first and second diffraction grating layers 112a, 112b, and the connecting layer 113.

The connecting layer 113 and the cladding layer 119 are formed integrally with each other.

A p-electrode 120 is provided on an upper surface of the cladding layer 119, and an n-electrode 121 is provided on a lower surface of the semiconductor substrate 111.

Further, reflection reducing films 122a, 122b are formed on facets of the active layer 118 from which a single-mode beam 123 is outputted, and facets of the first and second diffraction grating layers 112a, 112b.

Note that a contact layer made of p-type InGaAsP or p-type InGaAs can be interposed between the cladding layer 119 and the p-electrode 120.

In the DFB semiconductor laser according to the seventh embodiment configured as the above, the active layer 118 emits a beam having a multiple of wavelengths when a predetermined current is injected between the p-electrode 120 and the n-electrode 121.

The length L in the propagation direction of the beam 123 of the connecting layer 113 which is sandwiched between the first and second diffraction grating layers 112a, 112b is determined, as in the DFB semiconductor laser according to the fourth embodiment, by the amount of three-dimensional phase shift Δd of the first and the second diffraction gratings 116a, 116b and cross-sectional shape difference between the first and second diffraction grating layers 112a, 112b and the connecting layer 113.

Therefore, the DFB semiconductor laser according to the seventh embodiment can offer generally the same function and advantages as offered by the DFB semiconductor laser according to the fourth embodiment shown in FIG. 9 since the length L of the connecting layer 113 in the propagation direction of the beam 123 can be set generally freely as in the case in the fourth embodiment.

Note that, in the DFB semiconductor laser according to the seventh embodiment, the first and second diffraction grating layers 112a, 112b are disposed above the active layer 118.

For this reason, only one cycle of growth is necessary for formation of the active layer 118 through the first and second diffraction grating layers 112a, 112b. This offers another advantage that the number of layers to be grown can be reduced by one.

Further, the active layer 118 can be grown first, and then the grating pitch (pitch) in the diffraction grating of the first and second diffraction grating layers 112a, 112b can be set.

(Eighth Embodiment)

Figure 16:
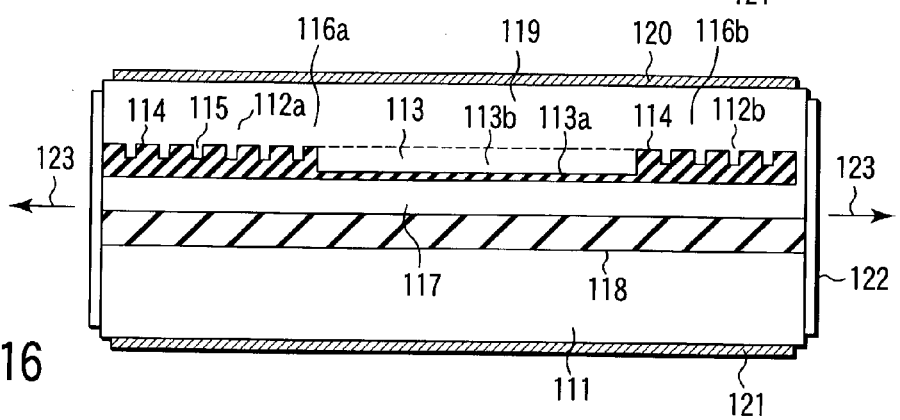
FIG. 16 is a schematic sectional view for explaining a general configuration of a DFB semiconductor laser according to an eighth embodiment of the present invention.

FIG. 16 is a schematic sectional view for explaining a general configuration of a DFB semiconductor laser according to an eighth embodiment of the present invention.

In FIG. 16, components identical with those in the DFB semiconductor laser according to the fourth embodiment shown in FIG. 9 are given the same reference codes and their description will not be duplicated here.

In the DFB semiconductor laser according to the eighth embodiment, a connecting layer 113 existing between first and second diffraction grating layers 112a, 112b is formed from two layers, i.e. a lower layer 113a and an upper layer 113b.

The upper layer 113b is formed of the same material as a cladding layer 119 above.

Likewise, the lower layer 113a is formed of the same material as the first and second diffraction grating layers 112a, 112b.

Further, spatial between bars 114 in first and second diffraction gratings 116a, 116b formed in the first and second diffraction grating layers 112a, 112b is provided not by the slits 115 penetrating from upper to lower surfaces but by bottomed grooves 115a.

Therefore, in the DFB semiconductor laser according to the eighth embodiment, all of the first diffraction grating layer 112a, the connecting layer 113 and the second diffraction grating layer 112b disposed in the output direction of a beam 123 are connected by the same material.

Thus, the DFB semiconductor laser according to the eighth embodiment can offer generally the same functions and advantages as achieved by the DFB semiconductor laser according to the fifth embodiment shown in FIG. 13.

(Ninth Embodiment)

Figure 17:
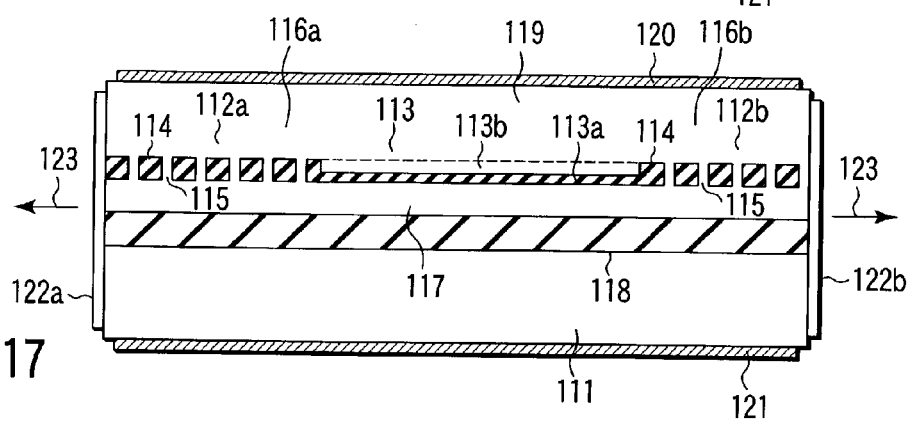
FIG. 17 is a schematic sectional view for explaining a general configuration of a DFB semiconductor laser according to a ninth embodiment of the present invention.

FIG. 17 is a schematic sectional view for explaining a general configuration of a DFB semiconductor laser according to a ninth embodiment of the present invention.

In FIG. 17, components identical with those in the DFB semiconductor laser according to the eighth embodiment shown in FIG. 16 are given the same reference codes and their description will not be 25 duplicated here.

As shown in FIG. 17, in the DFB semiconductor laser according to the ninth embodiment of the present invention, spatial between bars 114 of first and second diffraction gratings 116a, 116b is formed by slits 115, differing from the eighth embodiment.

In the DFB semiconductor laser according to the ninth embodiment, as in the DFB semiconductor laser according to the eighth embodiment, the first diffraction grating 116a and the second diffraction grating 116b have an amount of three-dimensional phase shift Δd.

Such a structure in which the groove between each pair of bars 114 is formed by the slit 115 leads to accuracy improvement of shape and size of the first and the second diffraction gratings 116a, 116b when the first and the second diffraction gratings 116a, 116b are formed by means of etching.

Further, by adjusting the amount of phase shift Δd, the length L of the connecting layer 113 can be given a desirably large value, resulting in a gentle beam-intensity distribution characteristic 124 (See FIG. 11B) in the DFB semiconductor laser, and reduced spatial hole burning.

(Tenth Embodiment)

Figure 18:
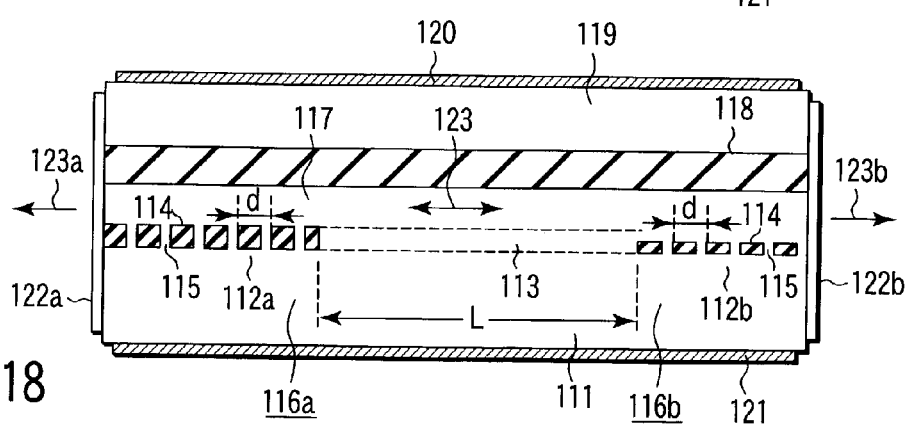
FIG. 18 is a schematic sectional view for explaining a general configuration of a DFB semiconductor laser according to a tenth embodiment of the present invention.

FIG. 18 is a schematic sectional view for explaining a general configuration of a DFB semiconductor laser according to a tenth embodiment of the present invention.

In FIG. 18, components identical with those in the DFB semiconductor laser according to the fourth embodiment shown in FIG. 9 are given the same reference codes and their description will not be duplicated here.

In the DFB semiconductor laser according to the tenth embodiment of the present invention, coupling efficiency $\kappa_1$ in a diffraction grating 116a of a first diffraction grating layer 112a and a coupling efficiency $\kappa_2$ in a diffraction grating 116b of a second diffraction grating layer 112b are set to values different from each other.

Further, in the DFB semiconductor laser according to the tenth embodiment of the present invention, a volume ratio $v_1$ per grating pitch d in the diffraction grating 116a of the first diffraction grating layer 112a, which is a ratio between the volume of bar 114 and the volume of the other parts including the slit 115, is set to a different value from that of a volume ratio $v_2$ in the diffraction grating 116b of the second diffraction grating layer 112b.

Since the bars 114 and the slits 115 of the first and the second diffraction gratings 116a, 116b in the first and second diffraction grating layers 112a, 112b are formed respectively of the same material, the volume ratios $v_1$ and $v_2$ control to the coupling efficiencies $\kappa_1$ and $\kappa_2$, if influences caused by refractive index are neglected.

Specifically, the first and second diffraction grating layers 112a, 112b which are spaced from each other by the connecting layer 113 have a constant grating pitch (pitch) d, but the first and the second diffraction gratings 116a, 116b formed respectively by the first and second diffraction grating layers 112a, 112b are different from each other in their shape.

In each of the first and the second diffraction gratings 116a, 116b, the grating pitch d includes one bar 114 and one slit (or groove) 115. With this, there is defined the predetermined volume ratio v for a grating pitch d, between the volume of the bar 114 and the volume of the parts other than the bar 114 including the slit 115.

The volume ratio v is determined by the width of bar 114 in the proceeding direction of beam 123, the height of the bar 114, the width of the bar 114 in a direction perpendicular to the proceeding direction of beam 123, and so on.

According to the embodiment in FIG. 10, the height of the bar 114 in the proceeding direction of beam 123 is given a greater value in the diffraction grating 116a of the first diffraction grating layer 112a than the height of the bar 114 in the proceeding direction of beam 123 in the diffraction grating 116b of the second diffraction grating layer 112b. In this way, since the volume ratio $v_1$ for the diffraction grating 116a of the first diffraction grating layer 112a is made different from the volume ratio $v_2$ for the diffraction grating 116b of the second diffraction grating layer 112b; ($v_1 > v_2$), the coupling efficiency $\kappa_1$ for the first diffraction grating 116a is different from the coupling efficiency $\kappa_2$ for the second diffraction grating 116b. ($\kappa_1 > \kappa_2$).

As a result, beam reflective index in the diffraction grating 116a of the first diffraction grating layer 112a is different from the beam reflective index in the diffraction grating 116b of the second diffraction grating layer 112a.

This enables to differentiate the strength of the beam 123a outputted from the facet on the side of first diffraction grating layer 112a from the strength of the beam 123b outputted from the facet on the side of the second diffraction grating layer 112b.

Thus, in the DFB semiconductor laser according to the tenth embodiment, it becomes possible to intentionally raise the intensity of the beam outputted from one facet of the DFB semiconductor laser relatively to the intensity of the beam outputted from the other facet.

According to the tenth embodiment, the intensity of the beam 123b outputted from the facet on the side of the second diffraction grating layer 112b is set to be greater than the intensity of the beam 123a outputted from the facet on the side of the first diffraction grating layer 112a.

Note that according to the tenth embodiment, the intensity of the beam 123b outputted from the facet on the side of the second diffraction grating layer 112b is made greater by giving a smaller reflection index to a reflection reducing coating 122b on the facet of the second diffraction grating layer 112b than a reflection index given to a reflection reducing coating 122a on the facet of the first diffraction grating layer 112a.

In this case, the reflection reducing coating 122a formed on the facet on the side of the first diffraction grating layer 112a may be a high reflection coating or may be left as a facet.

Note that this invention is applicable to the sixth to ninth embodiments described above with reference to FIGS. 14, 15, 16, and 17. Specifically, the coupling efficiency $\kappa_1$ in the diffraction grating 116a of the first diffraction grating layer 112a can be differentiated from the coupling efficiency $\kappa_2$ in the diffraction grating 116b of the second diffraction grating layer 112.

FIG. 19A to FIG. 19H are views for explaining a method of manufacturing the DFB semiconductor laser in which the volume ratio $v_1$ (coupling efficiency $\kappa_1$) for the diffraction grating 116a of the first diffraction grating layer 112a is differentiated from the volume ratio $v_2$ (coupling efficiency $\kappa_2$) for the diffraction grating 116b of the second diffraction grating layer 112b. The views illustrate steps until the first and the second diffraction gratings 116a, 116b are formed.

Hereinafter, in referring to FIG. 19A through FIG. 19H, description will be given for a method of manufacturing such a DFB semiconductor laser as according to the tenth embodiment shown in FIG. 18, i.e. a case in which the first and second diffraction grating layers 112a, 112b are formed below the active layer 118.

Figure 19A:
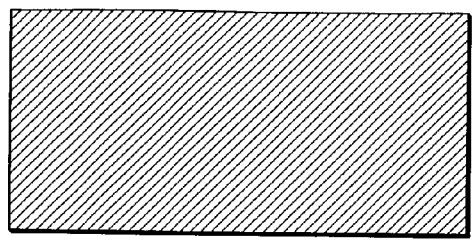
FIG. 19A to FIG. 19H are views for explaining a method of manufacturing the DFB semiconductor laser according to the tenth embodiment of the present invention.
Figure 19B:
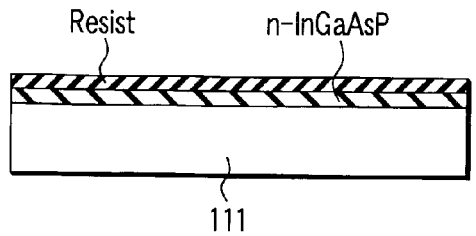

First, as shown in FIG. 19A and FIG. 19B, first and second diffraction grating layers 112a, 112b are formed on a semiconductor substrate 111 of n-type InP. Specifically, a layer of n-type InGaAsP for generation at 1.08 µm wavelength is grown to a thickness of 0.1 µm. On this layer then, an electron beam resist (e.g. ZEP-520 manufactured by Zeon Corporation) is applied to a thickness of 0.2 µm.

After heat treatment, diffraction grating pattern drawing is performed by means of electron beam lithography.

Figure 19C:
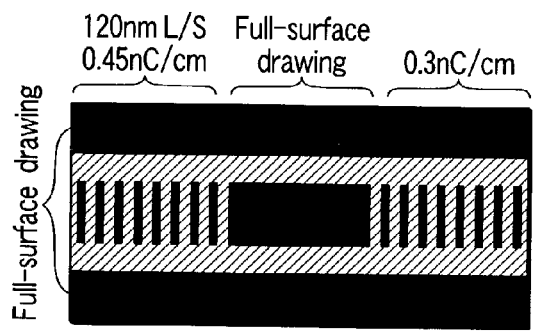
Figure 19D:
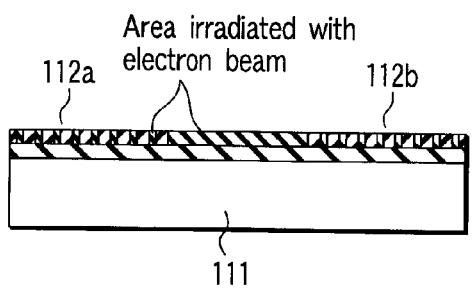

FIG. 19C and FIG. 19D show a drawing pattern and drawing conditions according to the tenth embodiment, where the grating pitch (pitch) d of diffraction gratings 116a, 116b is set to 240 nm.

The drawing conditions include that a relatively large dosage (e.g. about 0.45 nC/cm) is used for the first diffraction grating layer 112a (left side in FIG. 19C and FIG. 19D) serving as the outputting side when the chip is complete, whereas a relatively small dosage (e.g. about 0.3 nC/cm) is used for the second diffraction grating layer 112b on the other side, and thereby the electron beam is irradiated.

Surrounding regions may be exposed by the electron beam or ultraviolet rays.

The diffraction grating pattern thus drawn is then developed.

Figure 19E:
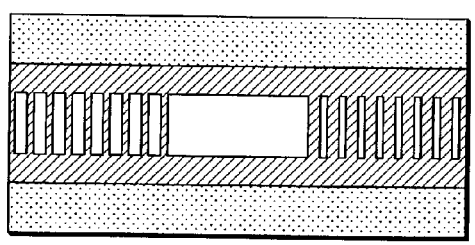
Figure 19F:
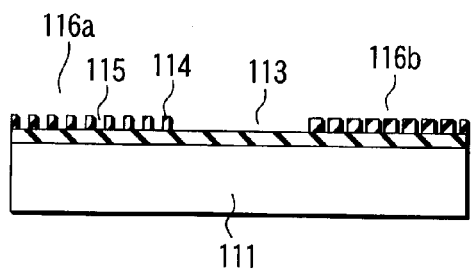

As shown in FIG. 19E and FIG. 19F, according to the tenth embodiment, the resist pattern after the development gives a predetermined slit 115 of about 140 nm for a region with a high dosage and about 70 nm for a region with a low dosage, between each pair of bars 114 in the first and the second diffraction gratings 116a, 116b.

Etching is performed in this state for about 20 seconds by using a water solution of saturated bromine water and phosphoric acid.

Figure 19G:
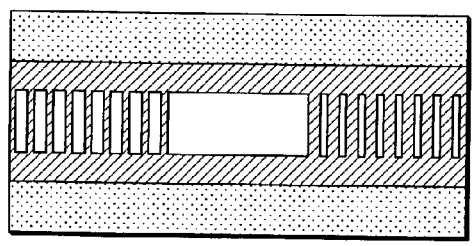
Figure 19H:
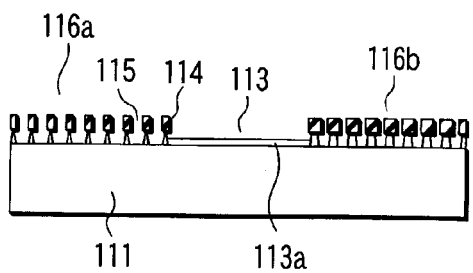

Then, cross-sectional shapes as shown in FIG. 19G and FIG. 19H are obtained. Due to heating in the subsequent crystal growth step, the difference in width of the bars 114 is transferred into the difference in height of the bars 114.

Thus, manufacture is made for a DFB semiconductor laser having a structure in which the diffraction grating 116a on the beam outputting side has a smaller volume ratio $v_1$ while the diffraction grating 116b on the other side has a greater volume ratio $v_2$; ($v_1 < v_2$).

As other methods than changing the dosage, it is possible to utilize a phenomenon that the etching rate at etching varies depending on the exposed area of the wafer.

Specifically, when an area of the wafer surface covered with etching inhibitors such as a resist or dielectric coating is small, and an area to be etched is small, the etching rate is high. On the other hand, the etching rate is low when a large area is etched. This phenomenon is commonly known in the etching process in the above-mentioned water solution of saturated bromine water and phosphoric acid, for example.

By utilizing this characteristic, when resist patterns 131, 132, 133 as shown in FIG. 20A, FIG. 20B and FIG. 20C are formed, it is possible to partially form the diffraction gratings having different volume ratios v.

As shown in FIG. 20A, the etching rate becomes lower when etching is performed after removing a surrounding resist 131a of the resist pattern 131.

In this case, even when electron beam lithography is not used, manufacture is possible in the interferometric exposure method.

As shown in FIG. 20B, the etching rate can be controlled by changing the width of grating patterns 132a, 132b (e.g. 20 μm for the grating pattern 132a, and 100 μm for the grating pattern 132b) in the direction perpendicular to the beam propagating direction in the resist pattern 132.

The above description has been made for a case of using positive resists. However, the same applies to a case of using negative resists.

Further, in either case, the resist may not necessarily be applied directly on the n-type InGaAsP. For example, an n-type InP layer of 30-nm thickness may be interposed therebetween, and the etching may be performed in two steps, using a selective etchant.

In this case, with the resist serving as the etching mask, etching is made for about 5 seconds in an etchant containing saturated bromine water to remove InP partially.

Then, for the exposed n-type InGaAsP, etching can be performed by using the n-type InP as the etching mask in a water solution containing sulfuric acid and hydrogen peroxide, for example.

According to the above method, the water solution containing sulfuric acid and hydrogen peroxide selectively etches the InGaAsP only. This can work advantageously in the formation of diffraction grating on the active layer in particular, because the etching ceases on the InP surface of the buffer layer, making it possible to prevent unwanted over-etching into the active layer.

On the other hand, since the connecting layer 113 is entirely exposed, the etching rate becomes lower. For this reason, a thin film of n-type InGaAsP layer (113a) tends to remain on the connecting layer 113, even if the slit 115 in the first and the second diffraction gratings 116a, 116b have been etched to the InP surface.

Thus, when this layer (113a) is to be removed completely as shown in FIG. 20C, regions surrounding the resist pattern 133 may be coated with another resist 133c for example, to reduce the exposed area by increasing the etching rate.

Specifically, in this case, the etching rate can be controlled by controlling the exposed area. Therefore, it is possible to control the depth of etching to be completed by the time the diffraction grating has been etched to the InP substrate (about 30 seconds).

In this case, the grating pattern width is differentiated by giving a 20 μm-width to the grating pattern 133a as compared to a 100 μm-width to the grating pattern 133b.

In any case, the surrounding regions may be left in any condition since they are anyway etched into a mesa pattern of a 2 to 3 micron width along the output direction of the beam 123 when being processed in laser in the subsequent steps.

As has been described, in the DFB semiconductor lasers according to the fourth to tenth embodiments of the present invention, a three-dimensional phase shift in grating arrangement is provided between the first and the second diffraction gratings in the first and second diffraction grating layers. Therefore, it is possible to set the length of the connecting layer freely, which enables to increase beam intensity of the outputted beam easily, to set the wavelength of outputted beam accurately to a desired wavelength, and to improve wavelength stability of the outputted beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their effectives.

What is claimed is:

1. A distributed feedback semiconductor laser comprising:
   a semiconductor substrate;
   first and second diffraction grating layers disposed above the semiconductor substrate and spaced from each other in an output direction of a beam so as to configure part of a virtual diffraction grating having a constant grating pitch and a continuous phase;
   a flat connecting layer sandwiched between the first and second diffraction grating layers;
   an active layer disposed above the first and second diffraction grating layers and the connecting layer; and
   a cladding layer disposed above the active layer,
   wherein a diffraction grating of each of the first and second diffraction grating layers has a plurality of slits penetrating from an upper surface to a lower surface and perpendicular to the output direction of the beam, and
   the connecting layer is formed from two layers grown epitaxially in a direction perpendicular to the output direction of the beam, one of the two layers being formed of the same material as the first and second diffraction grating layers.

2. The distributed feedback semiconductor laser according to claim 1, wherein a coupling efficiency ($\kappa_1$) in the diffraction grating of the first diffraction grating layer and a coupling efficiency ($\kappa_2$) in the diffraction grating of the second diffraction grating layer are set to values different from each other.

3. The distributed feedback semiconductor laser according to claim 1, wherein the semiconductor substrate is formed of InP, the first and second diffraction grating layers are formed of InGaAsP, the active layer is formed of a material containing InGaAsP, and the cladding layer is formed of InP.

4. The distributed feedback semiconductor laser according to claim 1, wherein the other of the two layers in the connecting layer is formed of the same material as the semiconductor substrate, a refractive index of each bar configuring the first and second diffraction grating layers is set higher than that of the semiconductor substrate, a buffer layer formed of the same material as the semiconductor substrate is formed on an upper surface of the first and second diffraction grating layers and the connecting layer each, and a p-electrode is provided on an upper surface of the cladding layer, and an n-electrode is provided on a lower surface of the semiconductor substrate.

5. The distributed feedback semiconductor laser according to claim 4, wherein selection is made, from a plurality of beams of different wavelengths emitted from the active layer upon injection of a predetermined current between the p-electrode and the n-electrode, for a single-mode beam having a single wavelength $\lambda_0$ determined by a grating pitch d of the diffraction grating and an effective refractive index $n_0$ of the first and second diffraction grating layers, whereby a laser oscillation state is achieved, and reflection reducing films are formed on at least one of facets of the active layer from which the single-mode beam is outputted and at least one of facets of the first and second diffraction grating layers, respectively.

6. A distributed feedback semiconductor laser comprising:
a semiconductor substrate;
an active layer disposed above the semiconductor substrate;
first and second diffraction grating layers provided above the active layer and spaced from each other in an output direction of a beam so as to configure part of a virtual diffraction grating having a constant grating pitch and a continuous phase;
a flat connecting layer sandwiched between the first and second diffraction grating layers; and
a cladding layer disposed above the first and second diffraction grating layers and the connecting layer,
wherein a diffraction grating of each of the first and second diffraction grating layers has a plurality of slits penetrating from an upper surface to a lower surface and perpendicular to the output direction of the beam, and
the connecting layer is formed from two layers grown epitaxially in a direction perpendicular to the output direction of beam, one of the two layers being formed of the same material as the first and second diffraction grating layers.

7. The distributed feedback semiconductor laser according to claim 6, wherein a coupling efficiency ($\kappa_1$) in the diffraction grating of the first diffraction grating layer and a coupling efficiency ($\kappa_2$) in the diffraction grating of the second diffraction grating layer are set values different from each other.

8. The distributed feedback semiconductor laser according to claim 6, wherein the semiconductor substrate is formed of InP, the first and second diffraction grating layers are formed of InGaAsP, the active layer is formed of a material containing InGaAsP, and the cladding layer is formed of InP.

9. The distributed feedback semiconductor laser according to claim 6, wherein the other of the two layers in the connecting layer is formed of the same material as the semiconductor substrate, a refractive index of each bar configuring the first and second diffraction grating layers is set higher than that of the semiconductor substrate, a buffer layer formed of the same material as the semiconductor substrate is formed on a lower surface of the first and second diffraction grating layers and the connecting layer, and a p-electrode is provided on an upper surface of the cladding layer, and an n-electrode is provided on a lower surface of the semiconductor substrate.

10. The distributed feedback semiconductor laser according to claim 9, wherein selection is made, from a plurality of beams of different wavelengths emitted from the active layer upon injection of a predetermined current between the p-electrode and the n-electrode, for a single-mode beam having a single wavelength $\lambda_0$ determined by a grating pitch d of the diffraction grating and an effective refractive index $n_0$ of the first and second diffraction grating layers, whereby a laser oscillation state is achieved, and reflection reducing films are formed on at least one of facets of the active layer from which the single-mode beam is outputted and at least one of facets of the first and second diffraction grating layers, respectively.

11. A distributed feedback semiconductor laser comprising:
a semiconductor substrate;
first and second diffraction grating layers disposed above the semiconductor substrate and spaced from each other in an output direction of a beam;
a connecting layer sandwiched between the first and second diffraction grating layers;
an active layer disposed above the first and second diffraction grating layers and the connecting layer; and
a cladding layer disposed above the active layer,
wherein a first diffraction grating which configures the first diffraction grating layer and a second diffraction grating which configures the second diffraction grating layer have the same grating pitch, and a phase of grating arrangement is shifted spatially between the first diffraction grating and the second diffraction grating.

12. The distributed feedback semiconductor laser according to claim 11, wherein a coupling efficiency ($\kappa_1$) in the diffraction grating of the first diffraction grating layer and a coupling efficiency ($\kappa_2$) in the diffraction grating of the second diffraction grating layer are set values different from each other.

13. The distributed feedback semiconductor laser according to claim 11, wherein the semiconductor substrate is formed of InP, the first and second diffraction grating layers is formed of InGaAsP, the active layer is formed of a material containing InGaAsP, and the cladding layer is formed of InP.

14. The distributed feedback semiconductor laser according to claim 11, wherein the connecting layer is formed from two layers grown epitaxially in a direction perpendicular to the output direction of the beam, one of the two layers being formed of the same material as the first and second diffraction grating layers, the other of the two layers in the connecting layer being formed of the same material as the semiconductor substrate, a refractive index of each bar configuring the first and second diffraction grating layers is set higher than that of the semiconductor substrate, a buffer layer formed of the same material as the semiconductor substrate is formed on an upper surface of the first and second diffraction grating layers and the connecting layer each, and a p-electrode is provided on an upper surface of the cladding layer, and an n-electrode is provided on a lower surface of the semiconductor substrate.

15. The distributed feedback semiconductor laser according to claim 14, wherein selection is made, from a plurality of beams of different wavelengths emitted from the active layer upon injection of a predetermined current between the p-electrode and the n-electrode, for a single-mode beam having a single wavelength $\lambda_0$ determined by a grating pitch d of the diffraction grating and an effective refractive index $n_0$ of the first and second diffraction grating layers, whereby a laser oscillation state is achieved, and reflection reducing films are formed on at least one of facets of the active layer from which the single-mode beam is outputted and at least one of facets of the first and second diffraction grating layers, respectively.

16. A distributed feedback semiconductor laser comprising:

a semiconductor substrate;

an active layer disposed above the semiconductor substrate;

first and second diffraction grating layers provided above the active layer and spaced from each other in an output direction of a beam;

a connecting layer sandwiched between the first and second diffraction grating layers; and a cladding layer disposed above the first and second diffraction grating layers and the connecting layer, wherein a first diffraction grating which configures the first diffraction grating layer and a second diffraction grating which configures the second diffraction grating layer have the same grating pitch, and a phase of grating arrangement is shifted spatially between the first diffraction grating and the second diffraction grating.

17. The distributed feedback semiconductor laser according to claim 16, wherein a coupling efficiency ($\kappa_1$) in the diffraction grating of the first diffraction grating layer and a coupling efficiency ($\kappa_2$) in the diffraction grating of the second diffraction grating layer are set values different from each other.

18. The distributed feedback semiconductor laser according to claim 16, wherein the semiconductor substrate is formed of InP, the first and second diffraction grating layers are formed of InGaAsP, the active layer is formed of a material containing InGaAsP, and the cladding layer is formed of InP.

19. The distributed feedback semiconductor laser according to claim 16, wherein the connecting layer is formed from two layers grown epitaxially in a direction perpendicular to the output direction of beam, one of the two layers being formed of the same material as the first and second diffraction grating layers, the other of the two layers in the connecting layer being formed of the same material as the semiconductor substrate, a refractive index of each grating in the first and second diffraction grating layers is set higher than that of the semiconductor substrate, a buffer layer formed of the same material as the semiconductor substrate is formed on a lower surface of the first and second diffraction grating layers and the connecting layer each, and a p-electrode is provided on an upper surface of the cladding layer, and an n-electrode is provided on a lower surface of the semiconductor substrate.

20. The distributed feedback semiconductor laser according to claim 19, wherein selection is made, from a plurality of beams of different wavelengths emitted from the active layer upon injection of a predetermined current between the p-electrode and the n-electrode, for a single-mode beam having a single wavelength $\lambda_0$ determined by a grating pitch d of the diffraction grating and an effective refractive index $n_0$ of the first and second diffraction grating layers, whereby a laser oscillation state is achieved, and reflection reducing films are formed on at least one of facets of the active layer from which the single-mode beam is outputted and at least one of facets of the first and second diffraction grating layers, respectively.

* * * * *